US010048962B2

(12) United States Patent
Amidi et al.

(10) Patent No.: US 10,048,962 B2
(45) Date of Patent: Aug. 14, 2018

(54) APPARATUS, SYSTEM, AND METHOD FOR NON-VOLATILE DATA STORAGE AND RETRIEVAL

(71) Applicant: Xitore, Inc., Mission Viejo, CA (US)

(72) Inventors: Mike Hossein Amidi, Lake Forest, CA (US); Hossein Hashemi, Lagunal Niguel, CA (US); Douglas Lane Finke, Orange, CA (US)

(73) Assignee: XITORE, INC., Mission Viejo, CA (US)

( * ) Notice: Subject to any disclaimer, the term of this patent is extended or adjusted under 35 U.S.C. 154(b) by 87 days.

(21) Appl. No.: 15/426,886

(22) Filed: Feb. 7, 2017

(65) Prior Publication Data
US 2017/0147213 A1 May 25, 2017

Related U.S. Application Data

(60) Continuation-in-part of application No. 15/144,653, filed on May 2, 2016, now Pat. No. 9,569,209, which
(Continued)

(51) Int. Cl.
*G06F 9/30* (2018.01)
*G06F 12/06* (2006.01)
(Continued)

(52) U.S. Cl.
CPC ............... *G06F 9/30* (2013.01); *G06F 3/061* (2013.01); *G06F 3/0605* (2013.01);
(Continued)

(58) Field of Classification Search
CPC ........ G06F 9/30; G06F 12/06; G06F 12/0223; G06F 12/0638
See application file for complete search history.

(56) References Cited

U.S. PATENT DOCUMENTS 3,944,991 A * 3/1976 Murakami ......... G11C 19/0875
365/15
4,347,584 A * 8/1982 Fukushima ............ G11C 17/18
365/104
(Continued)

*Primary Examiner* — Joseph D Torres
(74) *Attorney, Agent, or Firm* — Fish IP Law, LLP

(57) ABSTRACT

A computer memory device and a method of storing data are provided. The computer memory device includes a parallel memory interface configured to be operatively coupled to a system memory controller, to receive data and commands including logical addresses from the system memory controller, and to transmit data to the system memory controller. The parallel memory interface is configured to respond to the commands from the storage device driver of a computer processing unit. The computer memory device further includes an address translation circuit configured to receive the logical addresses from the parallel memory interface and to translate the received logical addresses to corresponding physical addresses. The computer memory device further includes a non-volatile memory operatively coupled to the parallel memory interface and the address translation circuit. The non-volatile memory is configured to receive the physical addresses and the data and to store the data at memory locations of the non-volatile memory corresponding to the physical addresses.

15 Claims, 13 Drawing Sheets

Related U.S. Application Data is a division of application No. 14/559,776, filed on Dec. 3, 2014, now Pat. No. 9,354,872.

(60) Provisional application No. 61/983,944, filed on Apr. 24, 2014.

(51) Int. Cl.
| | | |
|---|---|---|
| *G06F 12/02* | (2006.01) | |
| *G06F 3/06* | (2006.01) | |
| *G06F 12/0802* | (2016.01) | |
| *G06F 12/0888* | (2016.01) | |
| *G06F 12/10* | (2016.01) | |
| *G06F 11/10* | (2006.01) | |
| *G11C 29/52* | (2006.01) | |
| *G11C 8/06* | (2006.01) | |
| *G11C 29/04* | (2006.01) | |

(52) U.S. Cl.
CPC .......... *G06F 3/0619* (2013.01); *G06F 3/0635* (2013.01); *G06F 3/0655* (2013.01); *G06F 3/0659* (2013.01); *G06F 3/0661* (2013.01); *G06F 3/0673* (2013.01); *G06F 3/0679* (2013.01); *G06F 3/0685* (2013.01); *G06F 3/0688* (2013.01); *G06F 11/10* (2013.01); *G06F 11/1004* (2013.01); *G06F 12/0223* (2013.01); *G06F 12/06* (2013.01); *G06F 12/0638* (2013.01); *G06F 12/0802* (2013.01); *G06F 12/0888* (2013.01); *G06F 12/10* (2013.01); *G11C 29/52* (2013.01); *G06F 2206/1014* (2013.01); *G06F 2212/152* (2013.01); *G06F 2212/261* (2013.01); *G06F 2212/401* (2013.01); *G06F 2212/403* (2013.01); *G11C 8/06* (2013.01); *G11C 2029/0411* (2013.01)

(56) References Cited

U.S. PATENT DOCUMENTS

| | | | |
|---|---|---|---|
| 6,622,206 B1* | 9/2003 | Kanamaru | G06F 3/0613 710/56 |
| 8,001,434 B1 | 8/2011 | Lee et al. | |
| 8,275,946 B1* | 9/2012 | Smith | G06F 12/0862 711/137 |
| 8,301,833 B1 | 10/2012 | Chen et al. | |
| 8,359,501 B1 | 1/2013 | Lee et al. | |
| 8,516,185 B2 | 8/2013 | Lee et al. | |
| 8,516,187 B2 | 8/2013 | Chen et al. | |
| 8,713,379 B2 | 4/2014 | Takefman et al. | |
| 2004/0266267 A1 | 12/2004 | Inaba | |
| 2005/0033992 A1 | 10/2005 | Inabe | |
| 2006/0047664 A1* | 3/2006 | Suzuki | G06F 11/2058 |
| 2006/0195468 A1* | 8/2006 | Yanagi | G06F 17/30943 |
| 2009/0006876 A1* | 1/2009 | Fukatani | G06F 3/0625 713/320 |
| 2009/0037652 A1* | 2/2009 | Yu | G06F 12/0246 711/103 |
| 2009/0313416 A1* | 12/2009 | Nation | G06F 12/0638 711/100 |
| 2011/0078373 A1* | 3/2011 | Hoffman | G06F 11/10 711/114 |
| 2011/0145486 A1* | 6/2011 | Owa | G06F 12/0246 711/103 |
| 2013/0042054 A1 | 2/2013 | Jung | |
| 2013/0173875 A1 | 4/2013 | Kim | |
| 2013/0173954 A1 | 4/2013 | Woo | |
| 2013/0185268 A1 | 4/2013 | Kim | |
| 2013/0132639 A1 | 5/2013 | Amidi et al. | |
| 2014/0108747 A1 | 4/2014 | Seol | |
| 2014/0372679 A1 | 12/2014 | Flynn | |
| 2015/0095693 A1* | 4/2015 | Chinnakkonda Vidyapoornachary | G11C 14/009 714/6.23 |

* cited by examiner

APPARATUS, SYSTEM, AND METHOD FOR NON-VOLATILE DATA STORAGE AND RETRIEVAL

This application is a continuation-in-part of U.S. patent application Ser. No. 15/144,653 filed on May 4, 2016, which is a divisional of U.S. patent application Ser. No. 14/559776, filed on Dec. 3, 2014, now issued U.S. Pat. No. 9,354,872, which claims priority to U.S. Provisional Patent Application No. 61/983,944, filed on Apr. 24, 2014. These and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The present application is generally related to computer memory, and more particularly, to apparatuses, systems, and methods for data storage and retrieval using non-volatile computer memory.

BACKGROUND

The following description includes information that may be useful in understanding the present invention. It is not an admission that any of the information provided herein is prior art or relevant to the presently claimed invention, or that any publication specifically or implicitly referenced is prior art.

Computer systems operate, in part, using volatile memory. Computer memory modules using random access memory (RAM) typically do not retain any data once the main power source is lost (e.g., turned off or experiencing a power failure). In contrast, non-volatile computer memory, such as read only memory (ROM), tends to have long-term storage capacity, but tends to be slower than RAM.

As systems become more complex and mission-critical, the possibility of irreplaceable data being stored in volatile memory increases. For this reason, the majority of mission-critical data can be periodically stored in non-volatile memory. Various options are available for such non-volatile storage units, including but not limited to hard drive devices (HDD), solid state drives (SSD), or solid state storage (SSS) units. Computer systems utilizing such non-volatile memory can transfer data from a host's in-line volatile memory module directly connected to a main processing unit to the non-volatile memory operationally connected to the computer system. For example, the host's central processing unit can fetch data blocks from volatile memory and can send them out to the downstream controllers. Once the target controller receives these data blocks, they can be stored in the non-volatile memory.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Thus, there is still a need for improved computer memory devices.

SUMMARY OF THE INVENTION

The inventive subject matter provides apparatus, systems and methods in which a computer memory device processes a variety of commands using simple legacy interfaces.

Traditional legacy interfaces between a system memory controller and computer memory devices transmit one set of information and one command at a time. The system memory controller transmits at least a read/write identifier, a logical address, and sometimes a set of data (when writing information to the computer memory device). The new invention allows the system memory controller to transmit a large number of commands to the computer memory device using legacy settings by embedding command information within the set of data.

The computer memory device could comprise different types of memories, for example both volatile and non-volatile memory. Contemplated memory types include NAND, PCM (Phase Change Memory), SRAM, ReRAM (Resistive RAM), Memristor, 3D Xpoint, DDR and MRAM. There could be 2, 3, or more types of memories, such that multiple volatile and/or multiple non-volatile memories could be embedded in a single computer memory device. For example, a computer memory device with both NAND and MRAM could use the NAND memory for slower write cycles, and MRAM for faster write cycles.

In order to select from the different types of memory, the command for choosing which memory to read from or write to could be embedded within the logical address, or within the set of data that is sent to the computer memory device. The logical or physical memory address of the memory could also be embedded within the set of data. It is preferred that the memory address be embedded within the set of data to allow for addresses larger than those that can be transmitted by legacy systems to be transmitted to the computer memory device. Other commands could also be sent. For example, a host computer may want to copy or migrate data from one memory to another, or from one portion of a memory to another portion of that memory—for example from a cache to a data storage portion. Such commands could be transmitted to the computer memory device without needing the data to travel along the valuable system bus. The data merely copies or migrates data within the computer memory device. In other embodiments, a host computer may wish to check on the status of one or more states within the computer memory device (for example one or more read/write queues), and the computer memory device could return the status embedded within a return sequence.

In order to interpret these commands, a translating device or software module needs to be embedded within the computer memory device (typically as part of the firmware), and within the computer system itself (typically as a device driver of the computer system). The device driver needs to be able to receive a command, and translate that into the standard read/write identifier, logical address, and/or set of data transmitted to the computer memory device. The computer memory device needs to be able to read the information sent by the system memory controller and translate it into one or more commands. While all command information could be embedded within the set of data transmitted by the system memory controller (e.g. as a header to the set of data), preferred devices also use bits like the read/write identifier and the logical address sent in order to embed commands to minimize the footprint of the commands.

In certain embodiments, the computer memory device is configured to be operatively coupled to a computer system comprising a computer processing unit having a storage device driver and a system memory controller operatively coupled to the computer processing unit. The computer memory device comprises a parallel memory interface configured to be operatively coupled to the system memory controller, to receive data and commands comprising logical addresses from the system memory controller, and to transmit data to the system memory controller. The parallel memory interface is configured to respond to the commands from the storage device driver of the computer processing unit. The computer memory device further comprises an address translation circuit configured to receive the logical addresses from the parallel memory interface and to translate the received logical addresses to corresponding physical addresses. The computer memory device further comprises a non-volatile memory operatively coupled to the parallel memory interface and the address translation circuit. The non-volatile memory is configured to receive the physical addresses and the data and to store the data at memory locations of the non-volatile memory corresponding to the physical addresses.

In certain embodiments, a method of storing data is provided. The method comprises receiving commands from a system memory controller of a computer system. The commands comprise logical addresses and are received by a computer memory device comprising a parallel memory interface operatively coupled to the system memory controller and operatively coupled to a non-volatile memory. The method further comprises responding to the commands by translating the received logical addresses to corresponding physical addresses of the non-volatile memory. The method further comprises receiving data from the system memory controller by the parallel memory interface. The method further comprises storing the data at memory locations of the non-volatile memory corresponding to the physical addresses.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1A:
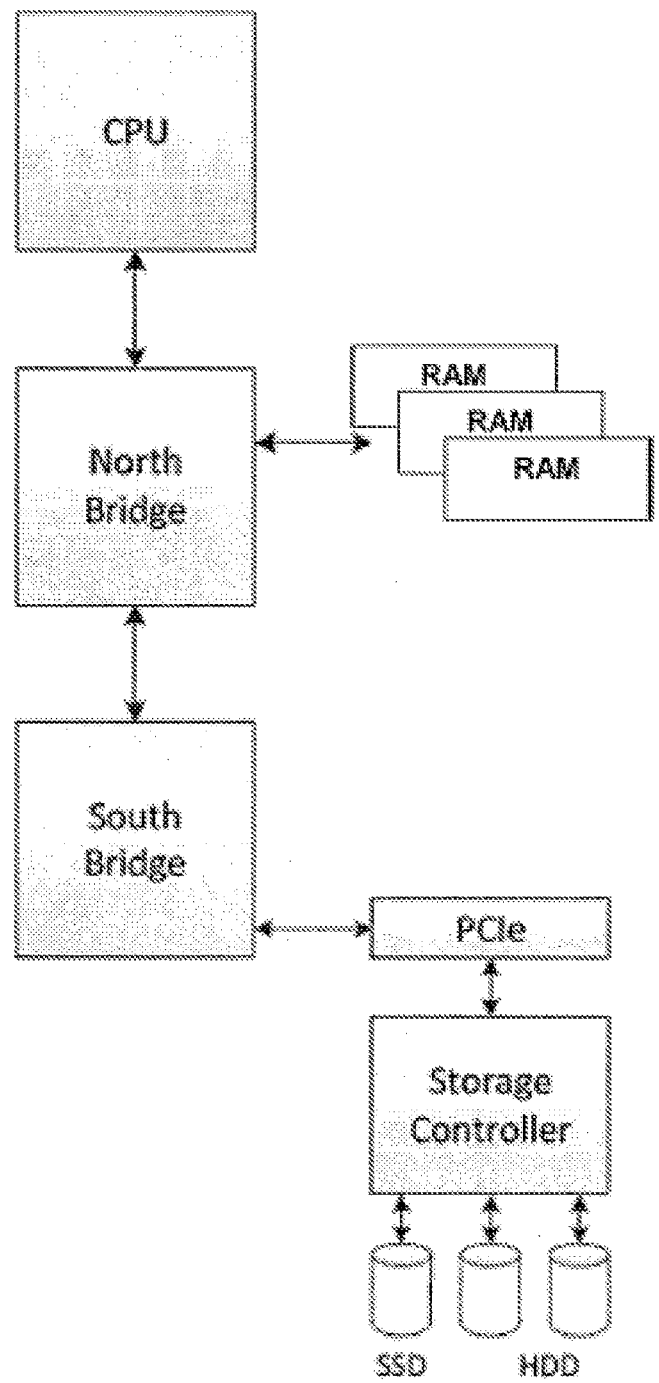
FIG. 1A schematically illustrates an example configuration of a conventional computer system including both volatile memory and non-volatile memory.

It should be noted that any language directed to a computer system should be read to include any suitable combination of computing devices, including servers, interfaces, systems, databases, agents, peers, engines, controllers, storage systems, or other types of computing devices operating individually or collectively. Computer systems may have full operating systems capable of executing complex processing tasks, or may be bare bones systems whose only function is to store, receive, and transmit data to memory storage units. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. A computer system that is "functionally coupled" or "communicatively coupled" to another computer system is one that is built to transmit and/or receive data from one computer system to another.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value with a range is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Conventional data transfers among volatile memory and non-volatile memory can require several hardware, firmware, and driver interactions using multiple hardware and software levels within one or more units. The overall latencies associated with existing non-volatile storage include the time required to fetch data blocks from volatile memory into a host processing unit, transferring data blocks from the host processing unit to a host main memory controller, sending the data blocks from the host main memory controller to a targeted storage controller via one or more data bridges, and storing the data blocks from the target storage controller into non-volatile memory media.

FIG. 1A schematically illustrates an example configuration of a conventional computer system including both volatile memory and non-volatile memory. A central processing unit (CPU) is operatively coupled to a north bridge (e.g., a host bridge, memory controller hub) circuit and to a south bridge (e.g., I/O controller hub) circuit. The north bridge circuit and the south bridge circuit can collectively be referred to as the chipset. The north bridge circuit is operatively coupled to volatile random access memory (RAM) (e.g., one or more volatile RAM modules in one or more DIMM slots) serving as the main memory of the computer system. The south bridge circuit is operatively coupled via one or more serial input/output bus interfaces (e.g., PCI express or PCIe bus) to a storage controller (e.g., serial ATA or SATA, serial attached SCSI or SAS, fiber channel or FC, etc.) which is operatively coupled to one or more non-volatile memory devices (e.g., solid state devices, hard drive devices, solid state storage devices, tape devices).

The CPU can comprise a host device driver that requests that a memory controller of the north bridge circuit read from or write to data sectors of the non-volatile memory devices. In this example, to execute READ commands to read data from the non-volatile memory devices, the following operations can occur:

The memory controller of the north bridge circuit sends data read requests to the south bridge circuit.

The south bridge circuit translates the data read requests to PCIe packets and sends the PCIe packets to the storage controller via the PCIe bus.

The storage controller translates the PCIe packets to READ storage commands and sends them to the appropriate non-volatile storage device.

The storage device interprets the READ storage commands, fetches the data, and responds back to the storage controller when the data being read is ready.

The storage controller reads and converts the data to PCIe packets and sends the PCIe packets to the south bridge circuit. The status is also appended to the end of the READ data.

The PCIe bus translates the PCIe packets back to raw data and sends the data via the south bridge circuit to the memory controller of the north bridge circuit.

The memory controller places the data into volatile RAM.

The host device driver examines the status of the command at the end of the READ data and informs the CPU that the data is ready.

In this example, to execute WRITE commands to write data to the non-volatile memory devices, the following operations can occur:

The memory controller of the north bridge circuit sends data write requests to the south bridge circuit.

The south bridge circuit translates the data write requests to PCIe packets and sends the PCIe packets to the storage controller via the PCIe bus.

The storage controller translates the PCIe packets to WRITE storage commands and sends them to the appropriate non-volatile storage device.

The storage device interprets the WRITE storage commands, and responds back to the storage controller when it is ready to accept the data to be written. (Some storage devices accept limited WRITE data with the WRITE storage commands).

The memory controller of the north bridge circuit transfers the data to be written from volatile RAM to the south bridge circuit.

The south bridge circuit translates the data to be written to PCIe packets and sends the PCIe packets to the storage controller via the PCIe bus.

The storage controller translates the PCIe packets to storage format and sends them to the appropriate non-volatile storage device.

The non-volatile storage device saves the data and responds back to the storage controller reporting the status that the data has been stored.

The storage controller transfers the status to the north bridge circuit via PCIe packets and the south bridge circuit.

The host device driver informs the CPU that the data has been stored.

As a result of the multiple intervening elements and steps between the north bridge circuit and the non-volatile memory of this multi-drop configuration, the overall latencies and bandwidth can be adversely affected.

Figure 1B:
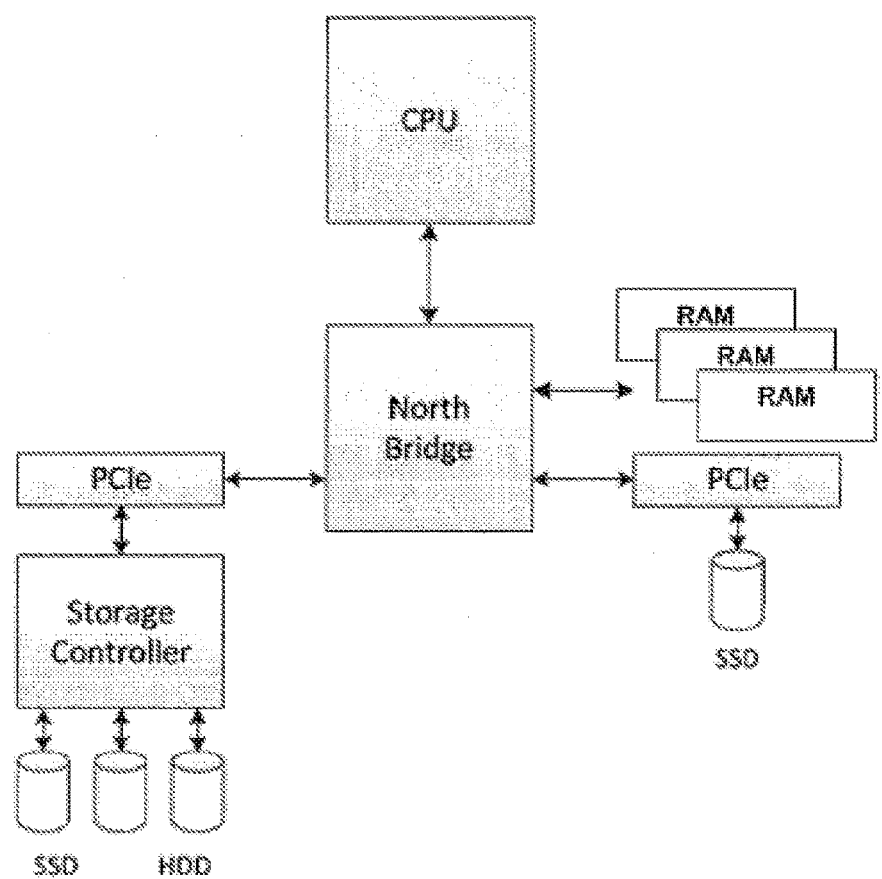
FIG. 1B schematically illustrates another example configuration of a conventional computer system including both volatile memory and non-volatile memory.

FIG. 1B schematically illustrates another example configuration of a conventional computer system including both volatile memory and non-volatile memory. In FIG. 1B, the south bridge circuit is eliminated from the CPU chipset. The north bridge circuit is operatively coupled to the volatile RAM and via the one or more serial input/output bus interfaces (e.g., PCIe bus) to a storage controller operatively coupled to one or more non-volatile memory devices. By eliminating the south bridge circuit, such configurations can reduce the number of steps for reading or writing data. For high-performance solid state devices, the storage controller can also be eliminated, as shown in the right-hand side of FIG. 1B. However, although the storage controller may have been eliminated by using the high-performance solid state device, the high-performance solid state device still has to perform translations between raw data and the serial PCIe packets to be able to read and write data.

Figure 1C:
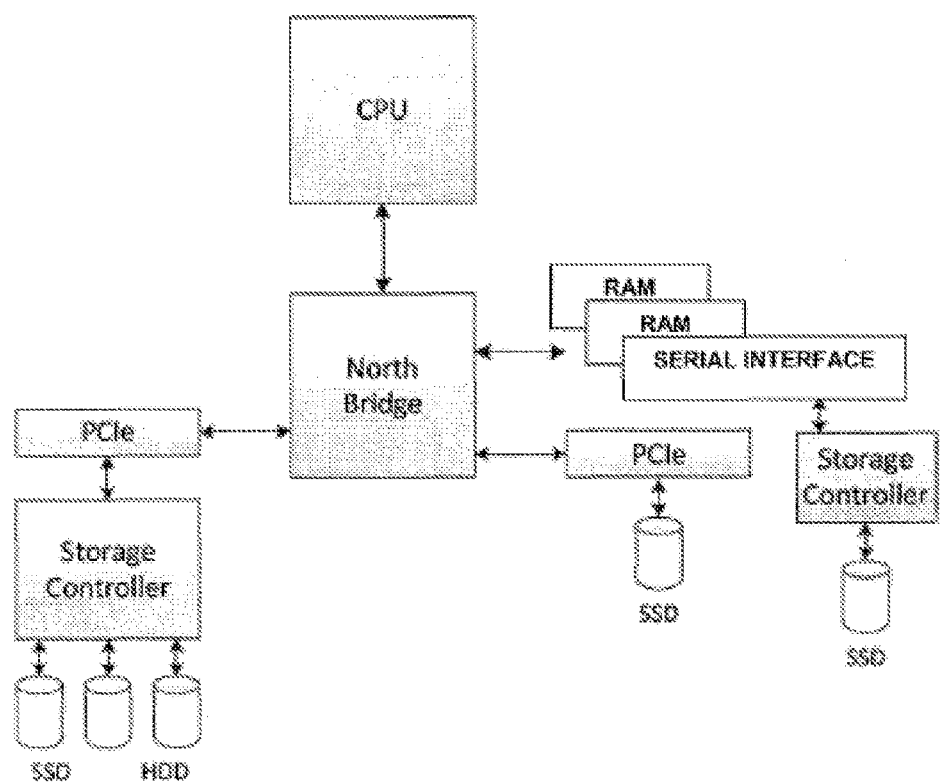
FIG. 1C schematically illustrates still another example configuration of a conventional computer system including both volatile memory and non-volatile memory.

FIG. 1C schematically illustrates still another example configuration of a conventional computer system including both volatile memory and non-volatile memory. In FIG. 1C, instead of being coupled to a volatile RAM module, a DIMM slot is operatively coupled to a serial interface which is operatively coupled to a corresponding non-volatile memory device (e.g., SSD) via a corresponding storage controller. The serial interface is used to transfer data and to convert raw data to or from the storage controller protocol (e.g., SATA). An example of such a configuration is described by U.S. Pat. No. 8,713,379.

Figure 2:
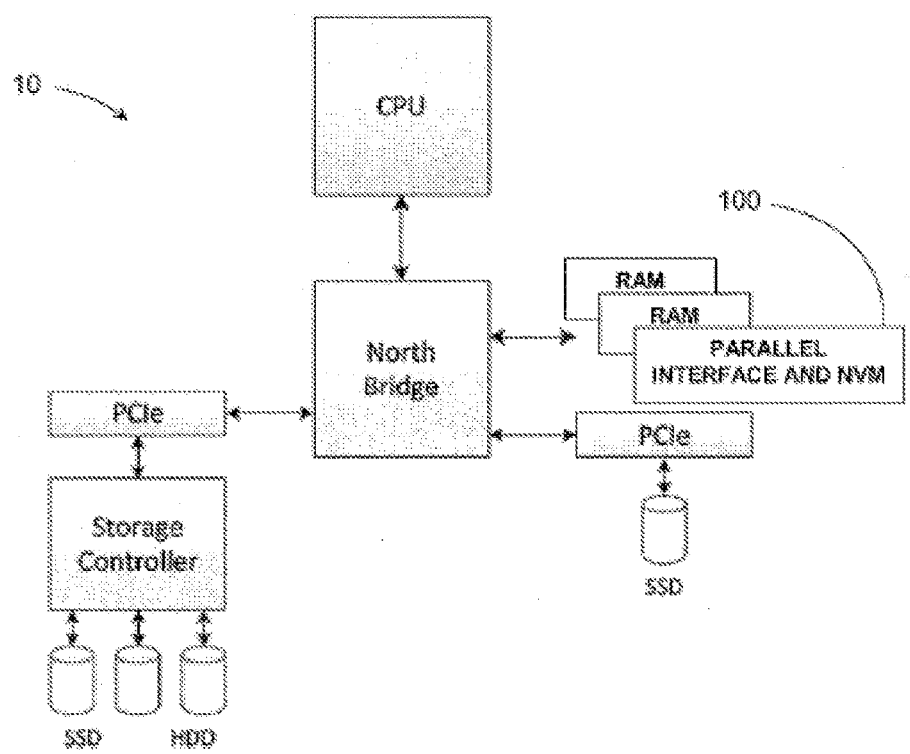
FIG. 2 schematically illustrates an example computer system operatively coupled to an example computer memory device in accordance with certain embodiments described herein.

FIG. 2 schematically illustrates an example computer system 10 operatively coupled to an example computer memory device 100 in accordance with certain embodiments described herein. The computer memory device 100 can be operatively coupled to a DIMM slot of the computer system 10, thereby advantageously moving the non-volatile memory significantly closer to the CPU than in conventional configurations. By operatively coupling the computer memory device 100 to the DIMM slot, the computer memory device 100 of certain embodiments can advantageously be placed among the volatile RAM modules of the main memory and can operate at the speed of the volatile RAM modules. The computer memory device 100 of certain embodiments advantageously does not require translation of data between various parts of the computer system 10, so data can flow between the volatile RAM modules of the main memory and the non-volatile memory of the computer memory device 100 without the intervention of host processing units. By not using a storage controller as done in conventional systems, certain embodiments described herein can advantageously use data in parallel format to be stored in the non-volatile memory of the computer memory device 100. The computer memory device 100 of certain embodiments can advantageously drastically improve inner host system communication, data transfer rates, and available data bandwidth, while reducing latencies related to volatile to non-volatile data transfers.

Figure 3:
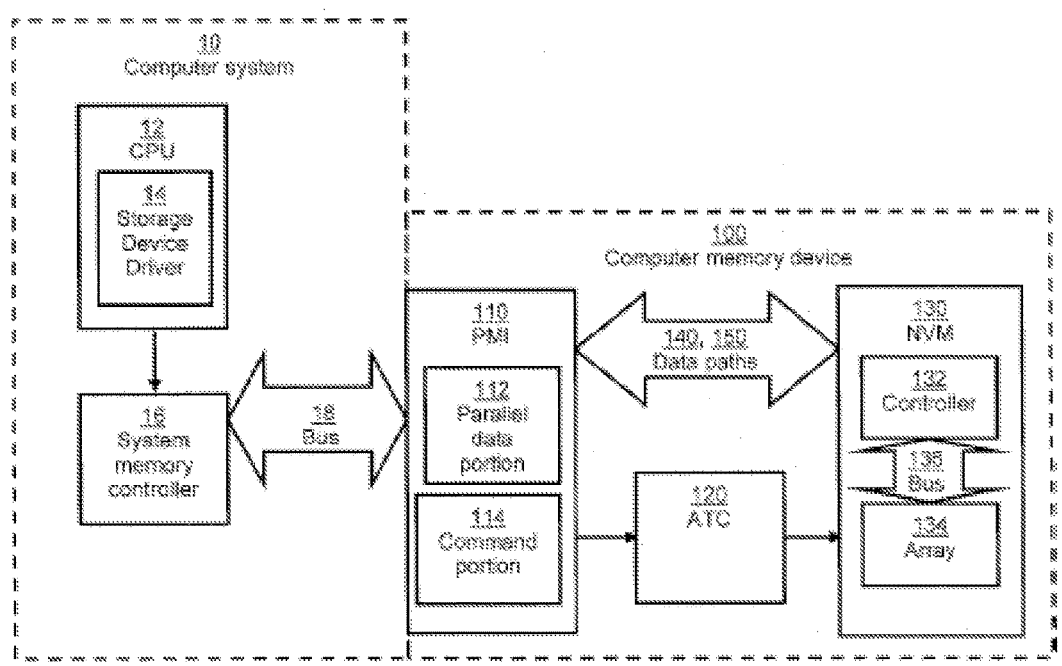
FIG. 3 schematically illustrates an example computer memory device in accordance with certain embodiments described herein.

FIG. 3 schematically illustrates an example computer memory device 100 in accordance with certain embodiments described herein. The computer memory device 100 is configured to be operatively coupled to a computer system 10 comprising a computer processing unit (CPU) 12 having a storage device driver 14 and a system memory controller 16 operatively coupled to the CPU 12. The computer memory device 100 comprises a parallel memory interface (PMI) 110 configured to be operatively coupled to the system memory controller 16, to receive data and commands comprising logical addresses from the system memory controller 16, and to transmit data to the system memory controller 16. The PMI 110 is configured to respond to the commands from the storage device driver 14 of the CPU 12. The computer memory device 100 further comprises an address translation circuit (ATC) 120 configured to receive the logical addresses from the PMI 110 and to translate the received logical addresses to corresponding physical addresses. The computer memory device 100 further comprises a non-volatile memory (NVM) 130 operatively coupled to the PMI 110 and the ATC 120. The NVM 130 is configured to receive the physical addresses and the data and to store the data at memory locations of the NVM 130 corresponding to the physical addresses.

In certain embodiments, the computer system 10 can comprise a host computer, examples of which include but are not limited to: a server (e.g., blade server, 1U server, database server, web server, gaming server, application server), personal computer (PC), data storage system. The CPU 12, the storage device driver 14, and the system memory controller 16 can be mounted on a system board of the host computer. The computer system 10 can further comprise a host system memory controller bus 18 operatively coupled to at least one host main memory interface, such as one or more host main memory module slots (e.g., one or more standard dual in-line memory module (DIMM) slots). The computer system 10 can further comprise one or more volatile RAM modules (not shown) operatively coupled to the one or more memory module slots. As described more fully below, at least one of the one or more memory module slots can be operatively coupled to the computer memory device 100 in accordance with certain embodiments described herein.

In certain embodiments, two or more of the CPU 12, the storage device driver 14, and the system memory controller 16 can be manifested, in whole or in part, in the same integrated circuit. For example, the storage device driver 14 can comprise a portion of the circuitry of the CPU 12 and/or can be a software module programmed into the CPU 12 and which resides in the memory of the CPU 12 of the host computer. The storage device driver 14 can be a dedicated hardware driver or software driver of the CPU 12 that communicates with the computer memory device 100 and that translates transactions from the CPU 12 for communication to the computer memory device 100. The system memory controller 16 can be a portion of a north bridge circuit that is operatively coupled to the CPU 12. The system memory controller 16 can be operatively coupled to the host system memory controller bus 18 and, via the memory controller bus 18, to a host main memory interface (e.g., a DIMM slot) that is configured to be operatively coupled to the computer memory device 100.

The PMI 110 of certain embodiments is configured to be operatively coupled to the host system memory controller bus 18. For example, the PMI 110 can be configured to be operatively coupled to a host main memory interface (e.g., a DIMM slot) that is operatively coupled to the memory controller bus 18, can receive data from the system memory controller 16, and can receive commands comprising logical addresses from the storage device driver 14 via the host main memory interface. The PMI 110 of certain embodiments can comprise a unidirectional interface which can be characterized as "dumb" in that the PMI 110 is configured to receive commands from the storage device driver 14 but can only transmit data, not other signals, to the storage device driver 14. The PMI 110 of certain such embodiments can present information (e.g., status) in a manner that can be read by the storage device driver 14, as described more fully below.

The PMI 110 can comprise a parallel data portion 112 configured to receive data in parallel from the computer system 10 and to transmit data in parallel to the computer system 10. The PMI 110 can further comprise a command portion 114 configured to receive commands from the computer system 10, the commands comprising logical addresses. The command portion 114 can comprise at least one command queue that is configured to store the commands received by the command portion 114 of the PMI 110 and at least one command status circuit that is configured to present status information regarding the commands in the at least one command queue in a manner that is accessible to the computer system 10. As described herein, the command portion 114 can be configured to receive a series of commands from the system memory controller 16 in a first order, and the computer memory device 100 (e.g., the at least one command queue) can be configured to execute the commands in a second order different from the first order (e.g., the second order can be based on relative priorities of the commands rather than the order in which the commands were received). Thus, the computer memory device 100 can be configured to execute a series of out-of-order commands on the at least one command queue (e.g., to improve internal bus utilization). Furthermore, the PMI 110 is configured to respond to commands from the storage device driver 14 of the CPU 12, as described herein.

The ATC 120 of certain embodiments is configured to receive logical addresses extracted from the commands received by the command portion 114 of the PMI 110 and to translate the received logical addresses to corresponding physical addresses corresponding to physical locations within the NVM 130 at which data received from the computer system 10 is to be stored within the NVM 130 and to physical locations within the NVM 130 at which data requested by the computer system 10 was previously stored within the NVM 130. As described more fully below in the various examples, in certain embodiments, the computer memory device 100 comprises volatile memory, and the ATC 120 is further configured to translate the received logical addresses to corresponding internal volatile memory addresses corresponding to physical locations within the volatile memory at which data received from the computer system 10 is to be stored within the volatile memory and to physical locations within the volatile memory at which data requested by the computer system 10 was previously stored within the volatile memory. In certain embodiments, the ATC 120 comprises an internal address cache which can be implemented using one of the following schemes: least recently used (LRU), least frequently used (LFU), most recently used (MRU), and the internal address cache can be utilize one or multiple way set associative architecture, in either write-through, write-back, read-through, or read-back policies.

In addition to translating host logical addresses to non-volatile memory physical addresses (and possibly to internal volatile memory addresses), in certain embodiments, the ATC 120 can be further configured to provide indications of the validity of data within the non-volatile memory physical addresses (and/or the internal volatile memory addresses). For example, for a computer memory device 100 comprising volatile memory, upon decoding a command received from the computer system 10, a logical address is transmitted to the ATC 120, and the ATC 120 can check the validity of the data either in the corresponding internal volatile memory address or the corresponding non-volatile memory physical address. For example, the ATC 120 can comprise dedicated validity flags for memory entries per each logical address for the non-volatile memory, for the volatile memory, or for both. Write data can be transferred to the internal volatile memory location identified by the ATC 120. Read data can be fetched from the internal volatile memory location if valid, or from the non-volatile memory physical location and placed in the internal volatile memory prior to transfer to the computer system 10. In certain embodiments, the ATC 120 can be configured to generate physical addresses that correspond to the logical addresses to reflect data transfers that are performed due to non-volatile memory management (e.g., avoidance of bad blocks).

The NVM 130 of certain embodiments is operatively coupled to the PMI 110 to receive data (e.g., via a write data path 140) that had been received by the PMI 110 from the computer system 100 (e.g., from the memory controller bus 18) and to provide data (e.g., via a read data path 150) to the PMI 110 that had been requested by the computer system 100. The NVM 130 of certain embodiments is also operatively coupled to the ATC 120 and configured to receive the physical addresses that correspond to the physical locations within the NVM 130 at which the data received from the PMI 110 is to be stored within the NVM 130 and the physical locations within the NVM 130 at which the data to be provided to the PMI 110 was previously stored within the NVM 130. Examples of NVM 130 that are compatible with certain embodiments described herein include, but are not limited to, hard drive devices (HDD), solid state drives (SSD), or solid state storage (SSS) units. In certain embodiments, the NVM 130 comprises a controller 132 (e.g., a non-volatile memory interface) and an array 134 of non-volatile memory locations operatively coupled to the controller 132 (e.g., via a parallel data bus 136 comprising a plurality of channels). The controller 132 can emulate a redundant array of independent disk (RAID) configuration. For example, the controller 132 of the NVM 130 can support one or more dedicated channels to non-volatile storage elements of the array 134.

In certain embodiments, the computer memory device 100 is controlled by the storage device driver 14 which can reside in the host CPU 12. For example, the PMI 110, the ATC 120, and the NVM 130 can be responsive to control signals from the storage device driver 14 to store data in the NVM 130 and to retrieve data that had been previously stored in the NVM 130. In this way, certain embodiments described herein can use minimal host CPU time to communicate (e.g., read and write data) between the computer memory device 100 and the computer system 10. In certain embodiments, the computer memory device 100 comprises one or more processors which receive control signals from the storage device driver 14 and which transmit corresponding control signals to the PMI 110, the ATC 120, the NVM 130, and other components of the computer memory device 100 to store and retrieve data using the NVM 130 while using minimal host CPU time to communicate (e.g., read and write data) between the computer memory device 100 and the computer system 10.

Figure 4A:
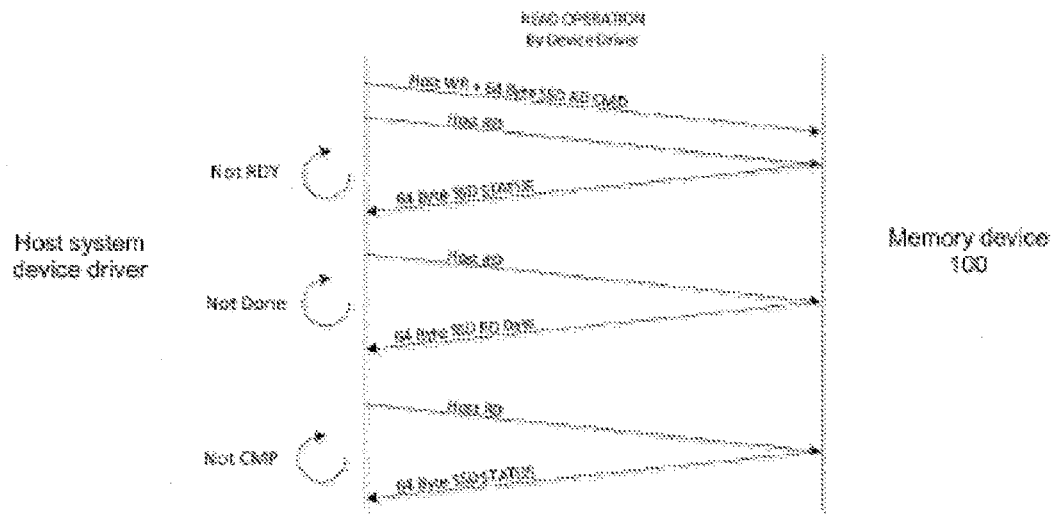
FIGS. 4A and 4B schematically illustrate an example read operation and an example write operation, respectively, controlled by the storage device driver of the host CPU in accordance with certain embodiments described herein.
Figure 4B:
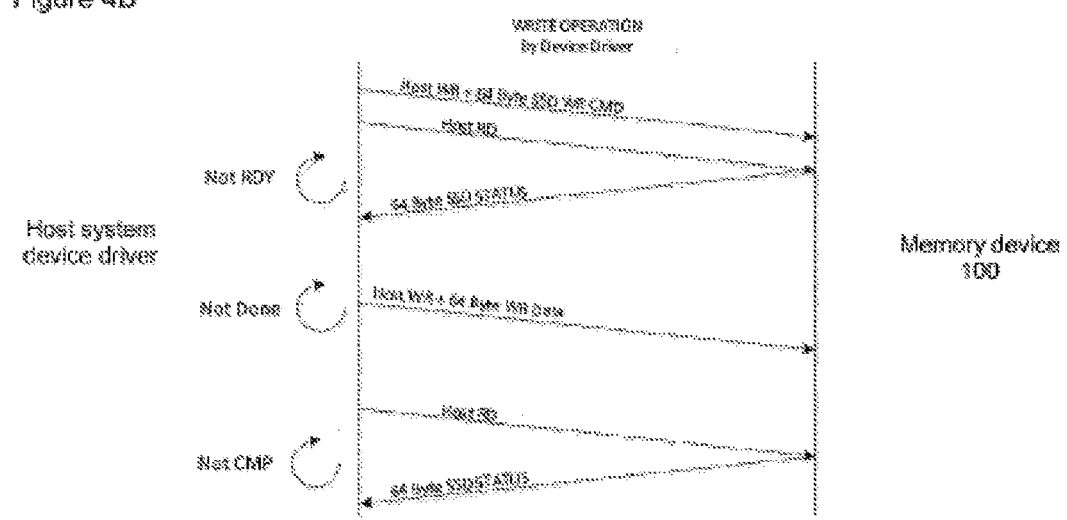
Figure 4C:
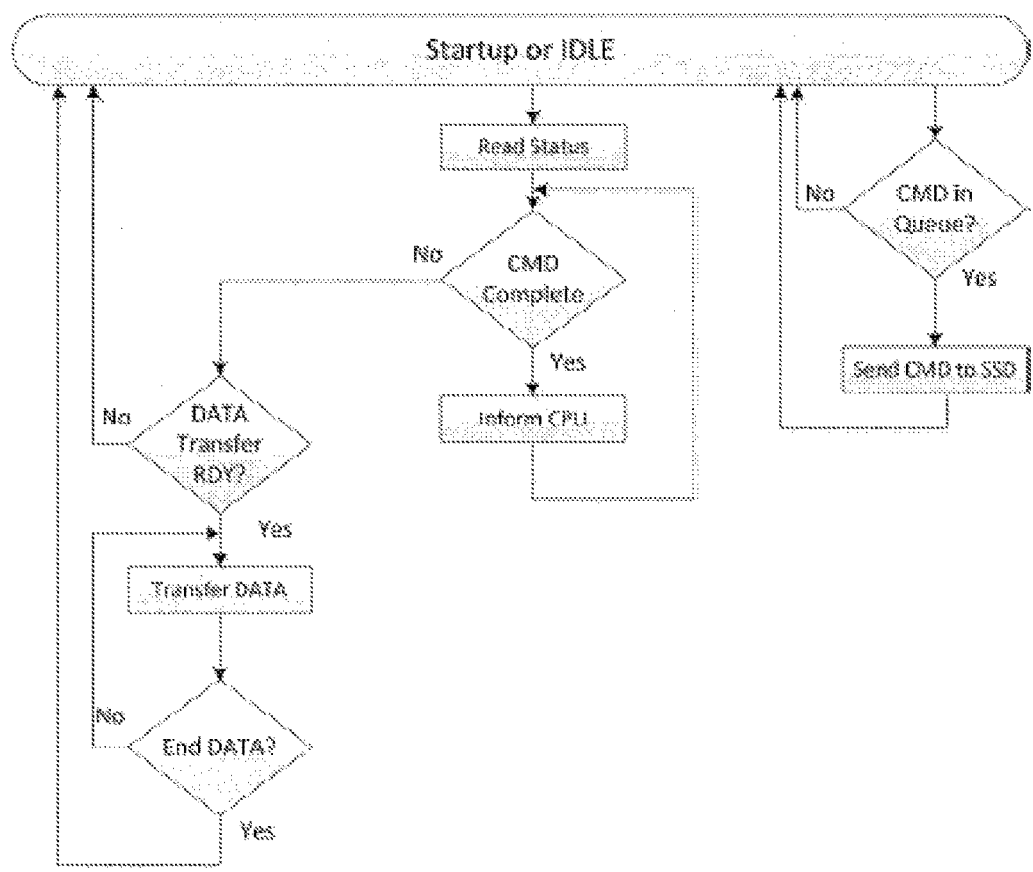
FIG. 4C is a flow diagram corresponding to the example read and write operations of FIGS. 4A and 4B.

FIGS. 4A and 4B schematically illustrate an example read operation and an example write operation, respectively, controlled by the storage device driver 14 of the host CPU 12 in accordance with certain embodiments described herein. FIG. 4C is a flow diagram corresponding to the example read and write operations of FIGS. 4A and 4B.

For the example read operation, the storage device driver 14 transmits a read command to the computer memory device 100. For example, a read command can be placed in a command queue of the PMI 110 to obtain data from a solid-state drive (SSD) of the NVM 130. The storage device driver 14 then repeatedly checks for the status of the read command (shown schematically in FIG. 4A by the "Not RDY" arrow) until the computer memory device 100 indicates that the status of the read command has changed to "data transfer ready." The host CPU 12 can then read the data from the computer memory device 100 (e.g., from the PMI 110) in as many data bursts as are needed to provide the data (shown schematically in FIG. 4A by the "Not Done" arrow), and the host CPU 12 can place the received data in the host main memory. The storage device driver 14 can then check the completion status of the read command (shown schematically in FIG. 4A by the "Not CMP" arrow), and once the computer memory device 100 indicates that the status of the read command is completed, the storage device driver 14 can inform the host CPU 12 that the read command has been completed.

For the example write operation, the storage device driver 14 transmits a write command to the computer memory device 100. For example, a write command can be placed in a command queue of the PMI 110 to store data in a solid-state drive (SSD) of the NVM 130. The storage device driver 14 then repeatedly checks for the status of the write command (shown schematically in FIG. 4B by the "Not RDY" arrow) until the computer memory device 100 indicates that the status of the write command has changed to "data transfer ready." The host CPU 12 can then write the data to the computer memory device 100 (e.g., provide the data to the PMI 110 ) in as many data bursts as are needed to provide the data (shown schematically in FIG. 4B by the "Not Done" arrow), and the computer memory device 100 can place the provided data in the NVM 130. The storage device driver 14 can then check the completion status of the write command (shown schematically in FIG. 4B by the "Not CMP" arrow), and once the computer memory device 100 indicates that the status of the write command is completed, the storage device driver 14 can inform the host CPU 12 that the write command has been completed.

In certain embodiments, the storage device driver 14 can transmit commands (e.g., read or write commands) to the computer memory device 100 at any time, and both the storage device driver 14 and the computer memory device 100 can have a copy of the command queue. For example, a master command queue can be in the storage device driver 14 and a slave copy of the command queue can be in the PMI 110, and the two command queues can be kept up-to-date by appropriate status reporting information being presented by the PMI 110 in a manner that is accessible to the storage device driver 14. The command queue can have a capacity limited to holding a predetermined number of active commands at any one time. Once a command has been completed, its position within the command queue can be replaced by another command (e.g., a new command or another command from within the command queue). The operation of replacing one command with another in the command queue can be an indication to the computer memory device 100 that the previous command has been completed in the host CPU 12.

In certain embodiments, each status read from the computer memory device 100 can include the statuses of some or all of the commands in the command queue. For certain embodiments in which commands can be executed out of order (e.g., transmitted from the storage device driver 14 to the computer memory device 100 in a first order, but executed by the computer memory device 100 in a second order different from the first order), more than one command can have a "data transfer ready" status.

In certain embodiments, the storage device driver 14 can transmit multiple data transfer commands for which the transferred data for the commands are interleaved with one another prior to reading completion statuses of the commands. In certain other embodiments, the storage device driver 14 can transmit multiple data transfer commands for which the transferred data for the commands are transmitted sequential to one another prior to reading the completion statuses of the commands. The steps of the commands can be executed in sequence with one another per command (e.g., one command is completed before a subsequent command is begun), resulting in the slowest execution of commands. However, in certain other embodiments, execution of the steps of the commands can be interleaved with one another or can be combined with one another. For example, the reading of the "data transfer ready" status and the completion status can be combined into one status check. Upon reading the completion status for a command, the storage device driver 14 can also check whether other commands are "data transfer ready" and/or if any other previous commands are also completed, thereby avoiding the use of a separate status check.

In certain embodiments in which the computer memory device 100 is operatively coupled to a DIMM slot of the computer system 10, the PMI 110 can be configured to respond to commands from the storage device driver 14 of the CPU 12 in a manner that utilizes the DIMM slot protocol. The storage device driver 14 can indicate to the system memory controller 16 how to operate the computer memory device 100 plugged into the DIMM slot. For example, a DIMM slot protocol for operating a DDR-3 volatile memory module can comprise activating a ROW address (e.g., page) followed by a read or write command and a COLUMN address. The data transfer phase can then start with a data burst (e.g., eight words of eight bytes each, totaling 64 bytes). The data transfer phase can continue by the storage device driver 14 issuing more commands during the data transfer phase until the boundary of the ROW (e.g., page) is reached.

Various combinations of ROW addresses, COLUMN addresses, BANK addresses, and Commands can be used to define specific operations of the computer memory device 100 in accordance with certain embodiments described herein. For example, Table 1 defines one example having four types of operations of the computer memory device 100 that can be performed. While Table 1 refers to an example embodiment in which a COLUMN address is indicated by a number from 0 to 1023 (e.g., by 10 bits), certain other embodiments can utilize COLUMN addresses that are indicated by a number from 0 to 2047 (e.g., by 11 bits as used for certain DDR-x configurations) or by other numbers or numbers of bits. In addition, while the example read and write operations are described as using data bursts of 64 bytes, other sizes of data bursts are also compatible with certain embodiments described herein.

TABLE 1

| Type of operation | Command on DIMM slot | DIMM Address | | |
| --- | --- | --- | --- | --- |
|  |  | BANK | ROW | COLUMN |
| Commands (all) | WRITE | 0 | 0 | 0-1023 |
| Response | READ | 0 | 0 | 0-1023 |

TABLE 1-continued

| Type of operation | Command on DIMM slot | DIMM Address | | |
|---|---|---|---|---|
| | | BANK | ROW | COLUMN |
| Write Data | WRITE | 1 | 0 | 0-1023 |
| Read Data | READ | 1 | 0 | 0-1023 |

For this example, a READ operation can be performed as follows:
- The computer system 10 (e.g., the storage device driver 14) transmits an ACTIVATE command with BANK address of 0 and ROW address of 0 to the DIMM slot and the command is detected by the computer memory device 100.
- The computer system 10 (e.g., the storage device driver 14) transmits a WRITE command with COLUMN address of x (e.g., where x is a number from 0 to 1023) to the DIMM slot and the command is detected by the computer memory device 100. The COLUMN address of x designates a location within the command queue.
- The computer system 10 (e.g., the storage device driver 14) transmits a data burst (e.g., 64 bytes) to the DIMM slot. The data burst denotes an encoded data read command including a logical address corresponding to the data being requested to be read from the NVM 130. The computer memory device 100 receives the data burst and places the encoded data read command in the command queue at the location designated by x.
- The computer memory device 100 decodes the command at location x of the command queue as a data read command and extracts the logical address of the data that is being requested.
- The computer memory device 100 internally requests the data (e.g., including translating the logical address to a physical address to be read) and places the data read from the corresponding physical location of the NVM 130 in a read buffer of the read data path in preparation of transmitting the data to the computer system 10.
- The computer memory device 100 prepares a Response word corresponding to the data read command that requested the data in the read buffer. For example, a "data transfer ready" or "RDY for Transfer" Response word (e.g., 64 bytes) can be prepared that identifies the location within the command queue of the command to which the "data transfer ready" Response word corresponds.
- The computer system 10 (e.g., the storage device driver 14) can transmit a READ command and a COLUMN address of y (e.g., where y is a number from 0 to 1023) to the DIMM slot and the command is detected by the computer memory device 100. The COLUMN address y designates the location within the command queue of the command to which the status is queried.
- The computer memory device 100 can update its command status circuit to note that this read command is ready (e.g., a "data transfer ready" Response word).
- The computer system 10 (e.g., the storage device driver 14) detects the Response word indicating that the data corresponding to the data read command is ready for transfer from the computer memory device 100.
- The computer system 10 (e.g., the storage device driver 14 ) transmits an ACTIVATE command with BANK address of 1 and ROW address of 0 to the DIMM slot and the command is detected by the computer memory device 100. Note that if the ROW and BANK had previously been opened, the ACTIVATE command may not be needed.
- The computer system 10 (e.g., the storage device driver 14) transmits a READ command with a COLUMN address of z (e.g., where z is a number from 0 to 1023) to the DIMM slot and the command is detected by the computer memory device 100. The COLUMN address of z designates a location in the command queue of the data read command corresponding to the data to be transmitted.
- The computer memory device 100 transmits the requested data from the read buffer (e.g., in one or more data bursts with a data burst comprising 64 bytes) to the computer system 10 (e.g., via the system memory controller bus 18). The data bursts can continue (e.g., by incrementing the COLUMN address to sequentially correspond to the multiple data bursts of 64 bytes each). If additional requested data is to be transmitted, the computer system 10 can transmit additional READ commands until the requested data is exhausted or a page boundary is reached. If the requested data is not completed when the page boundary is reached, the computer system 10 can transmit additional ACTIVATE commands and subsequent READ commands to get the computer memory device 100 to transmit additional data bursts. The computer memory device 100 can update its command status circuit to note that this read command is complete (e.g., a "read complete" Response word).
- The computer system 10 (e.g., the storage device driver 14) transmits an ACTIVATE command with BANK address 0 and ROW address 0 to the DIMM slot and the command is detected by the computer memory device 100.
- The computer system 10 (e.g., the storage device driver 14) transmits a READ command with COLUMN address of w (e.g., where w is a number from 0 to 1023) to the DIMM slot and the command is detected by the computer memory device 100. The COLUMN address of w designates a location in the command queue of the data read command for which status is being requested.
- The computer system 10 (e.g., the storage device driver 14) detects the "read complete"

Response word and informs the CPU 12 that the read operation is completed.

For this example, a WRITE operation can be performed as follows:
- The computer system 10 (e.g., the storage device driver 14) transmits an ACTIVATE command with BANK address of 0 and ROW address of 0 to the DIMM slot and the command is detected by the computer memory device 100.
- The computer system 10 (e.g., the storage device driver 14) transmits a WRITE command with COLUMN address of x (e.g., where x is a number from 0 to 1023) to the DIMM slot and the command is detected by the computer memory device 100. The COLUMN address of x designates a location within the command queue.
- The computer system 10 (e.g., the storage device driver 14) transmits a data burst (e.g., 64 bytes) to the DIMM slot. The data burst denotes an encoded data write command including a logical address corresponding to the data to be written to the NVM 130. The computer memory device 100 receives the data burst and places the encoded data write command in the command queue at the location designated by x.

The computer memory device 100 decodes the command at location x of the command queue as a data write command and extracts the logical address of the physical locations to which the data is to be written.

The computer memory device 100 internally requests memory space of the NVM 130 at which the data is to be written (e.g., including translating the logical address to a physical address to which the data is to be written).

The computer memory device 100 prepares a Response word corresponding to the data write command. For example, a "data transfer ready" or "RDY for Transfer" Response word (e.g., 64 bytes) can be prepared that identifies the location within the command queue of the command to which the "data transfer ready" Response word corresponds.

The computer system 10 (e.g., the storage device driver 14) can transmit a READ command and a COLUMN address of y (e.g., where y is a number from 0 to 1023) to the DIMM slot and the command is detected by the computer memory device 100. The COLUMN address of y designates the location within the command queue of the command to which the status is queried.

The computer memory device 100 can update its command status circuit to note that this write command is ready (e.g., a "data transfer ready" Response word).

The computer system 10 (e.g., the storage device driver 14) detects the Response word indicating that the NVM space corresponding to the data write command is ready for transfer of the data from the computer system 10.

The computer system 10 (e.g., the storage device driver 14) transmits an ACTIVATE command with BANK address of 1 and ROW address of 0 to the DIMM slot and the command is detected by the computer memory device 100. Note that if the ROW and BANK had previously been opened, the ACTIVATE command may not be needed.

The computer system 10 (e.g., the storage device driver 14) transmits a WRITE command with a COLUMN address of z (e.g., where z is a number from 0 to 1023) to the DIMM slot and the command is detected by the computer memory device 100. The COLUMN address of z designates a location in the command queue of the data write command corresponding to the data to be written.

The computer system 10 (e.g., the storage device driver 14) transmits the data to be written to the computer memory device 100 (e.g., in one or more data bursts with a data burst comprising 64 bytes). The computer memory device 100 places the data in a write buffer. The data bursts can continue (e.g., by incrementing the COLUMN address to sequentially correspond to the multiple data bursts of 64 bytes each). If additional data is to be written, the computer system 10 can transmit additional WRITE commands until the data to be written is exhausted or a page boundary is reached. If the data to be written is not completed when the page boundary is reached, the computer system 10 can transmit additional ACTIVATE commands and subsequent WRITE commands to get the computer memory device 100 to write additional data bursts.

The computer memory device 100 can write the data from the write buffer to the NVM 130.

The computer system 10 (e.g., the storage device driver 14) transmits an ACTIVATE command with BANK address 0 and ROW address 0 to the DIMM slot and the command is detected by the computer memory device 100.

The computer system 10 (e.g., the storage device driver 14) transmits a READ command with COLUMN address of w (e.g., where w is a number from 0 to 1023) to the DIMM slot and the command is detected by the computer memory device 100. The COLUMN address of w designates a location in the command queue of the data write command for which status is being requested.

The computer memory device 100 can update its command status circuit to note that this write command is complete (e.g., a "write complete" Response word).

The computer system 10 (e.g., the storage device driver 14) detects the "write complete"

Response word and informs the CPU 12 that the write operation is completed.

In the various examples of the computer memory device 100 described below, the computer memory device 100 comprises various components, circuitry, and features. While these components, circuitry, and features are described with regard to particular example configurations, people of ordinary skill in the art understand that the described components, circuitry, and features can be combined with one another, or with other components, circuitry, and features, in other combinations besides the specific combinations described in the particular example configurations and that a selected one or more of the described components, circuitry, and features can be omitted from other configurations which are still compatible with certain embodiments described herein. For instance, particular example configurations are described below in which the computer memory device 100 comprises one or more processors that are responsive to commands from the storage device driver 14 to control various components, circuitry, or features of the computer memory device 100. People skilled in the art understand that the functionality of these one or more processors can be combined together in a single processor or can be parsed differently among the one or more processors (e.g., into a different number of processors, organized among the one or more processors in different combinations).

Figure 5:
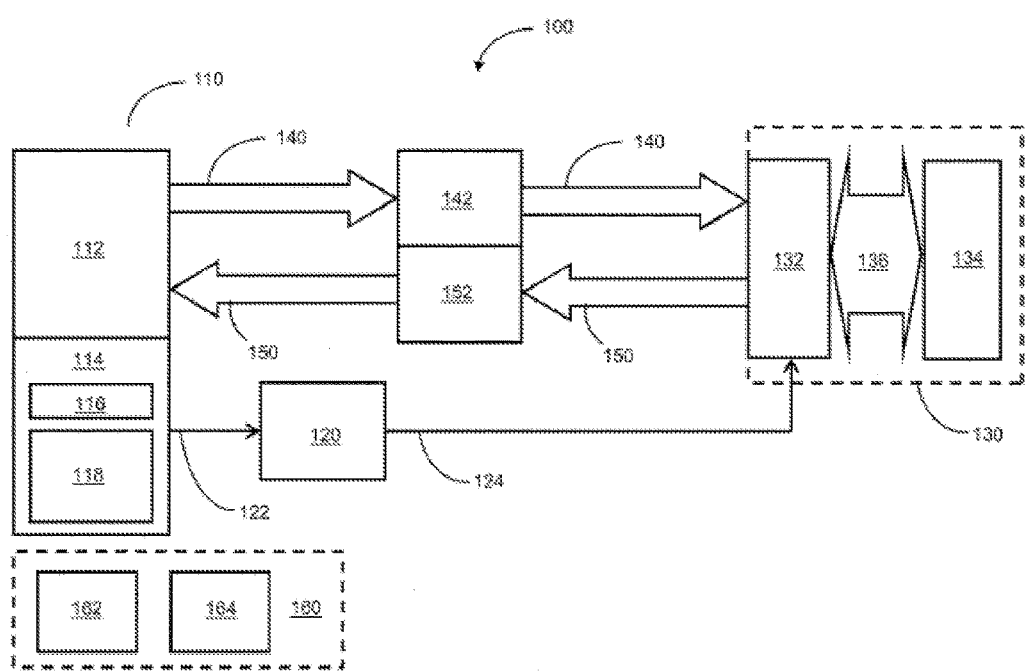
FIG. 5 schematically illustrates an example computer memory device in accordance with certain embodiments described herein.

FIG. 5 schematically illustrates an example computer memory device 100 in accordance with certain embodiments described herein. The parallel data portion 112 of the PMI 110 is configured to receive data in parallel from the computer system 10 and to transmit the received data in parallel to the NVM 130 via a write data path 140. The write data path 140 can comprise at least one write buffer 142 configured to facilitate proper data transfer from the PMI 110 to the NVM 130. The parallel data portion 112 of the PMI 110 is further configured to receive data in parallel from the NVM 130 via a read data path 150 and to transmit the received data in parallel to the memory control bus 18 of the computer system 10. The read data path 150 can comprise at least one read buffer 152 configured to facilitate proper data transfer from the NVM 130 to the PMI 110.

The command portion 114 of the PMI 110 is configured to receive commands comprising logical addresses from the system memory controller bus 18 of the computer system 10. In certain embodiments, the command portion 114 of the PMI 110 can comprise at least one command status circuit 116 and at least one command queue 118 configured to store the commands received by the command portion 114 of the PMI 110. The at least one command status circuit 116 is configured to maintain a record of the status of each of the active commands in the corresponding at least one command queue 118, and to facilitate the computer memory device 100 to perform the operations corresponding to the active commands in a proper order (e.g., by presenting status information regarding the commands in the at least one command queue 118 in a manner accessible to the computer system 10). For example, the command portion 114 can be configured to receive a series of commands from the system memory controller 16 in a first order, and the computer memory device 100 can be configured to execute the commands in a second order different from the first order (e.g., the second order can be based on relative priorities of the commands).

The ATC 120 is configured to receive logical addresses extracted from commands received by the command portion 114 of the PMI 110. For data received by the PMI 110 to be written to the NVM 130, the ATC 120 is configured to translate the received logical addresses 122 corresponding to the received data to physical addresses 124 of physical locations within the NVM 130 at which the received data is to be written. For data requested by the computer system 10 to be read from the NVM 130, the ATC 120 is configured to translate the received logical addresses 122 corresponding to the requested data to physical addresses 124 of physical locations within the NVM 130 at which the requested data requested by the computer system 10 can be read (e.g., physical locations at which the requested data was previously stored within the NVM 130).

The NVM 130 is configured to receive data from the PMI 110 via the write data path 140 and to provide data to the PMI 110 via the read data path 150. The NVM 130 is configured to receive from the ATC 120 the physical addresses 124 that correspond to the physical locations within the NVM 130 at which the received data from the PMI 110 is to be written and the physical locations within the NVM 130 from which the provided data is to be read. The data is transferred between the controller 132 of the NVM 130 and the array 134 of non-volatile memory locations of the NVM 130 via a parallel data bus 136 which comprises a plurality of channels (e.g., CH[n:0]).

The computer memory device 100 can comprise at least one processor 160 configured to respond to control signals from the storage device driver 14 and to provide appropriate control signals to the various other components of the computer memory device 100. In this way, the computer memory device 100 can be controlled by the storage device driver 14 which resides in the host CPU 12. For example, as shown in FIG. 5, the at least one processor 160 can comprise a first processor 162 (e.g., configured to control data transfer to and from the computer memory device 100 by providing control signals to the PMI 110, including the status register 116 and the command queue 118) and a second processor 164 (e.g., configured to control non-volatile memory management by providing control signals to the at least one write buffer 142, the at least one read buffer 152, and the controller 132 of the NVM 130). The first processor 162 and the second processor 164 can be configured to communicate with each other (e.g., using a task scheduler system, micro-operating system, custom firmware, or an off-the-shelf operating system) to control and schedule the various tasks to be performed to the various data blocks.

Figure 6:
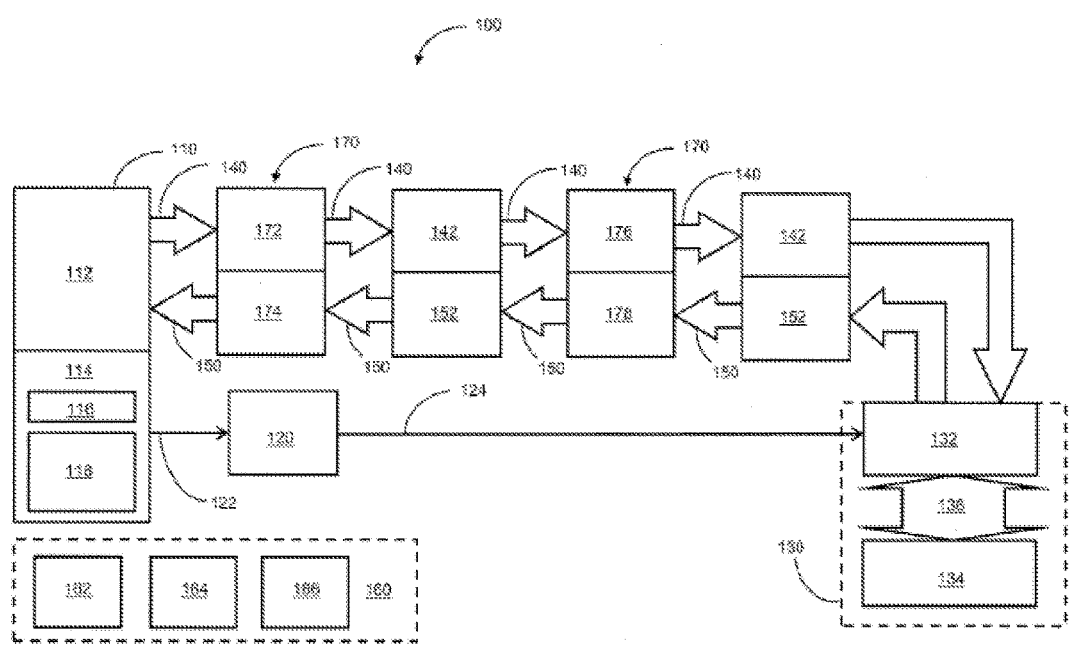
FIG. 6 schematically illustrates another example computer memory device in accordance with certain embodiments described herein.

FIG. 6 schematically illustrates another example computer memory device 100 in accordance with certain embodiments described herein. The example computer memory device 100 of FIG. 6 comprises the various components as described above with regard to FIG. 5, as well as other components of the write data path 140 and of the read data path 150. In particular, the example computer memory device 100 of FIG. 6 comprises one or more data processing circuits 170 configured to facilitate use of the data being transmitted between the computer system 10 and the NVM 130 of the computer memory device 100.

For example, the one or more data processing circuits 170 of the computer memory device 100 can provide a parallel cyclic redundancy check (CRC) capability for detection of errors in the data transmitted between the computer system 10 and the NVM 130 of the computer memory device 100. The parallel CRC capability can be provided by a CRC generation circuit 172 of the write data path 140 (e.g., between the PMI 110 and a write buffer 142; between the PMI 110 and the NVM 130) and a CRC check circuit 174 of the read data path 150 (e.g., between the PMI 110 and a read buffer 152; between the PMI 110 and the NVM 130). For each data block being transmitted along the write data path 140 to the NVM 130, the CRC generation circuit 172 can calculate a check value corresponding to the data in the data block (e.g., a CRC checksum) and to append the check value to the data block. For example, for a 16-bit CRC (CRC-16), the check value can be calculated using a polynomial of the form $(X16+X12+X5+1)$. Other parallel CRC schemes can also be used in accordance with certain embodiments described herein.

The check value remains with the data block during subsequent transfers and operations within the computer memory device 100 (e.g., being written to the NVM 130). For each data block later read from the NVM 130 and transmitted along the read data path 150, the CRC check circuit 174 can compare the check value that was previously appended to the data block with a current value corresponding to the current data of the data block, and can remove the previously-appended check value from the data block. A discrepancy between the previously-appended check value and the current value corresponding to the current data of the data block is indicative of an error which occurred in the data block. In certain such embodiments, the computer memory device 100 can be configured to flag such errors for appropriate action by the computer system 10 (e.g., by the host CPU 12, the system memory controller 16, and/or the computer memory device 100).

The one or more data processing circuits 170 can further provide other capabilities for facilitating the use (e.g., security, quality) of the data transmitted between the computer system 10 and the NVM 130 of the computer memory device 100. For example, the other data processing capability can comprise one or more of the following: data scrambling/descrambling, data compression/decompression, and other data error detection and correction. The one or more data processing circuits 170 of the computer memory device 100 can comprise at least one first data processing circuit 176 of the write path 140 (e.g., between two write buffers 142; between the PMI 110 and the NVM 130) and at least one second data processing circuit 178 of the read data path (e.g., between two read buffers 152; between the NVM 130 and the PMI 110). The at least one first data processing circuit 176 can receive data from one write buffer 142 and can transmit processed data to another write buffer 142 along (e.g., "downstream") the write data path 140. The at least one second data processing circuit 178 can receive data from one read buffer 152 and can transmit processed data (e.g., processed to reverse the process of the at least one first data processing circuit 176) to another read buffer 152 along (e.g., "downstream") the read data path 150.

For data security, the at least one first data processing circuit 176 can comprise a data scrambler circuit that is configured to apply a predetermined scrambling operation to the data blocks to be written to the NVM 130 and the at least one second data processing circuit 178 can comprise a data descrambler circuit that is configured to apply a predetermined descrambling operation, complementary to the scrambling operation of the data scrambler circuit, to the data blocks read from the NVM 130. Various algorithms may be used to perform both security (e.g., encoding) and scrambling of incoming data, along with security (e.g., decoding) and descrambling of outgoing data, in accordance with certain embodiments described herein (e.g., an AES 128-bit, or 192-bit, or 256-bit engine). Other algorithms for scrambling and descrambling can be used in accordance with certain embodiments described herein (e.g., ARC4) to cypher and decipher incoming and outgoing data. For data compression, the at least one first data processing circuit 176 can comprise a data compression circuit that is configured to apply a predetermined compression operation to the data blocks to be written to the NVM 130 and the at least one second data processing circuit 178 can comprise a data decompression circuit that is configured to apply a predetermined decompression operation, complementary to the compression operation of the data compression circuit, to the data blocks read from the NVM 130. Various algorithms may be used to perform both compression of incoming data and decompression of outgoing data in accordance with certain embodiments described herein (e.g., LZRW3 lossless based on Lempel-Ziv (LZ) compression method algorithm). For error correction, the at least one first data processing circuit 176 can comprise a error check generation circuit that is configured to calculate error check values for the data blocks to be written to the NVM 130 and the at least one second data processing circuit 178 can comprise a error check comparison circuit that is configured to compare a previously-calculated error check value with a current error check value for the data blocks read from the NVM 130 to detect errors that occurred between writing the data block to the NVM 130 and reading the data block from the NVM 130. Examples of error correction schemes that may be utilized by the data processing circuits 176, 178 include but are not limited to: Reed-Solomon encoder and decoder error detection and correction, low-density parity check (LDPC) encoder and decoder error detection and correction, BCH (Bose, Chaudhuri) algorithms, and Viterbi algorithms. For example, error correction code can be applied to data being stored at the memory locations of the NVM 130 (e.g., data being transmitted along the write data path 140) and error correction can be applied to data subsequently read from the memory locations of the NVM 130 (e.g., data being transmitted along the read data path 150).

After having traversed the various components of the write data path 140, the data can be written by the controller 132 to the array 134 of non-volatile memory locations (via the parallel data bus 136 comprising the plurality of channels) at a physical location that corresponds to the physical address 124 provided by the ATC 120. In addition, the data requested by the computer system 10 can be read from the NVM 130 at a physical location corresponding to the physical address 124 provided by the ATC 120 and transmitted to the PMI 110 via the various components of the read data path 150. The NVM 130 is configured to receive from the ATC 120 the physical addresses 124 corresponding to the physical locations within the NVM 130 from which the provided data is to be read. The data is transferred between the controller 132 of the NVM 130 and the array 134 of non-volatile memory locations of the NVM 130 via a parallel data bus 136 which comprises a plurality of channels (e.g., CH[n:0]).

In addition to the first processor 162 and the second processor 164 of the at least one processor 160, as described above with regard to FIG. 5, the at least one processor 160 of FIG. 6 can further comprise a third processor 166. The third processor 166 can be configured to respond to control signals from the storage device driver 14 and to provide appropriate control signals at appropriate times to various components of the computer memory device 100 (e.g., configured to control data processing by providing control signals to the at least one first data processing circuit 176 and the at least one second data processing circuit 178). The first processor 162, the second processor 164, and the third processor 166 can be configured to communicate with each other (e.g., using a task scheduler system, micro-operating system, custom firmware, or an off-the-shelf operating system) to control and schedule the various tasks to be performed to the various data blocks.

Figure 7A:
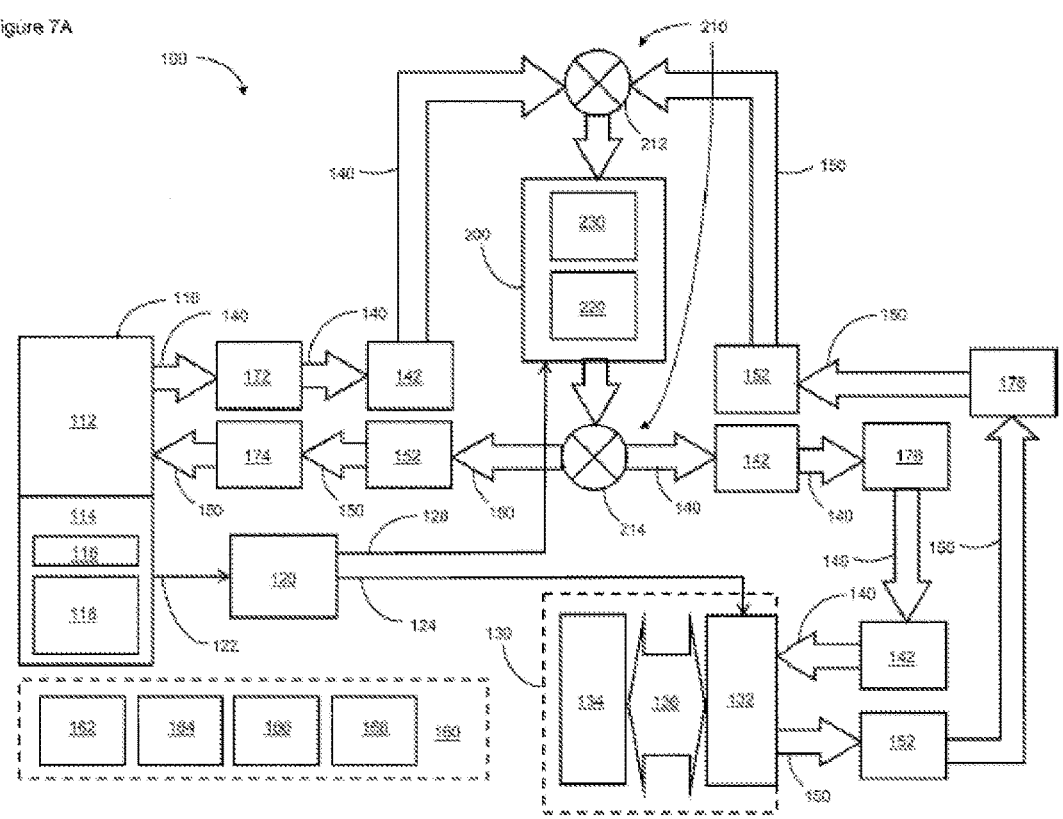
FIG. 7A schematically illustrates another example computer memory device in accordance with certain embodiments described herein.

FIG. 7A schematically illustrates another example computer memory device 100 in accordance with certain embodiments described herein. The example computer memory device 100 of FIG. 7A comprises the various components as described above with regard to FIGS. 5 and 6, as well as a volatile cache memory 200 and various other components to facilitate data transfer between the NVM 130 and the volatile cache memory 200. Data transfer to and from volatile memory can be much faster than data transfer to and from non-volatile memory (e.g., by an order of magnitude). Certain such embodiments advantageously use the volatile cache memory 200 as a data repository for a portion of data stored in the NVM 130, from which the data can be accessed faster than if the computer memory device 100 only included the NVM 130 (e.g., staging the data).

The computer memory device 100 of certain embodiments can comprise at least one data path selection circuit 210. As schematically illustrated in FIG. 7A, the at least one data path selection circuit 210 can comprise a multiplexer 212 configured to selectively transfer data being transmitted from the PMI 110 along the write data path 140 to the volatile cache memory 200 and to selectively transfer data being transmitted from the NVM 130 along the read data path 150 to the volatile cache memory 200. The at least one data path selection circuit 210 can further comprise a demultiplexer 214 configured to transfer data from the volatile cache memory 200 to be transmitted either along the write data path 140 to the NVM 130 or along the read data path 150 to the PMI 110. In certain embodiments, the multiplexer 212 and the demultiplexer 214 are configured to be operated independently of one another. Certain such embodiments can advantageously provide flexibility of the data path option to be used such that the PMI 110 can write to the volatile cache memory 200 while the volatile cache memory 200 transfers data to the NVM 130, to provide flexibility of the data path option to be used such that the volatile cache memory 200 can send data to the PMI 110 while the NVM 130 transfers data to the volatile cache memory 200, or both.

The volatile memory 200 can comprise a volatile memory controller 220 and an array 230 of volatile memory locations operatively coupled to the volatile memory controller 220. The volatile memory controller 220 can be operatively coupled to the ATC 120, which is configured to generate internal volatile memory addresses 126 corresponding to the logical addresses received by the PMI 110. For data provided by the computer system 10 in conjunction with a write command received by the PMI 110, the volatile memory controller 220 is further configured to receive the data from the multiplexer 212 and write the data to a physical location within the array 230 corresponding to the internal volatile memory address 126 received from the ATC 120 in conjunction with the write command. For data requested by the computer system 10 in conjunction with a read command received by the PMI 110, the volatile memory controller 220 is further configured to read the requested data from a physical location within the array 230 corresponding to the internal volatile memory address 126 received from the ATC 120 in conjunction with the read command and to transmit the requested data from the volatile memory 200 to the demultiplexer 214.

In addition to the processors 162, 164, 166 of the at least one processor 160, as described above with regard to FIG. 6, the at least one processor 160 of FIG. 7A can further comprise a fourth processor 168. The processors 162, 164, 166, 168 can be configured to respond to control signals from the storage device driver 14 and to provide appropriate control signals at appropriate times to control the various components of the computer memory device 100. For example, the first processor 162 can be configured to control the PMI 110, including the status register 116 and the command queue 118, as well as the CRC generation circuit 172 and the CRC check circuit 174, at least one write buffer 142 (e.g., the write buffer 142 immediately after the CRC generation circuit 172), and the ATC 120. The second processor 164 can be configured to control the volatile cache memory 200, including the volatile memory controller 220, at least one read buffer 152 (e.g., the read buffer 152 immediately before the CRC check circuit 174 and the read buffer 152 immediately before the multiplexer 212). The third processor 166 can be configured to control at least one write buffer 142 (e.g., the write buffer 142 immediately following the demultiplexer 214 and the write buffer 142 immediately before the NVM 130), the at least one first data processing circuit 176, and the at least one second data processing circuit 178. The fourth processor 168 can be configured to control at least one read buffer 152 (e.g., the read buffer 152 immediately after the NVM 130) and the NVM 130, including the non-volatile controller 132 (e.g., to perform non-volatile memory management). The processors 162, 164, 166, 168 can be configured to communicate with each other (e.g., using a task scheduler system, micro-operating system, custom firmware, or an off-the-shelf operating system) to control and schedule the various tasks to be performed to the various data blocks.

Figure 7B:
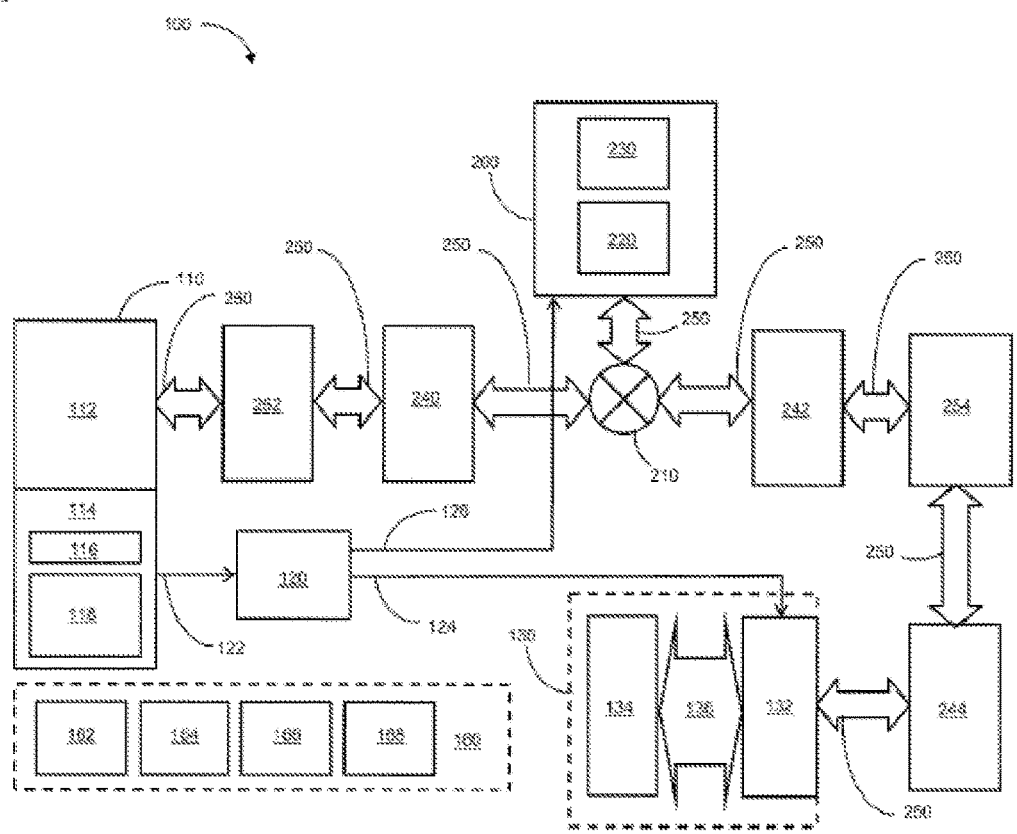
FIG. 7B schematically illustrates another example computer memory device in accordance with certain embodiments described herein.

FIG. 7B schematically illustrates another example computer memory device 100 in accordance with certain embodiments described herein. The example computer memory device 100 of FIG. 7B is similar to that of FIG. 7A, comprising the various components as described above with regard to FIGS. 5 and 6, as well as a volatile cache memory 200 and various other components to facilitate data transfer between the NVM 130 and the volatile cache memory 200. While FIG. 7A shows the write data path 140 and the read data path 150 separate from one another, FIG. 7B shows a bi-directional data path 250. In addition, while FIG. 7A has the at least one write buffer 142 and the at least one read buffer 152 separate from one another and the at least one data processing circuits 170 with separate components along the write and read data paths, FIG. 7B shows at least one data buffer (e.g., a first data buffer 240, a second data buffer 242, and a third data buffer 244) and at least one data processing circuit 170 (e.g., a first CRC data processing circuit 252 and a second data processing circuit 254 for data scrambling, compression, and error correction) that are in the bi-directional data path 250. Furthermore, the at least one data path selection circuit 210 can comprise a multiplexer/demultiplexer (mux/demux) configured to selectively transfer data being transmitted from the PMI 110 to the volatile cache memory 200, to selectively transfer data from the volatile cache memory 200 to be written to the NVM 130, to selectively transfer data read from the NVM 130 to the volatile cache memory 200, and to selectively transfer data from the volatile cache memory 200 to be transmitted to the PMI 110.

As shown in FIG. 7B, the at least one data path selection circuit 210 is configured to selectively transfer (i) data blocks received by the PMI 110 via the first data processing circuit 252 and the first data buffer 240 to the volatile memory 200 to be stored; (ii) data blocks retrieved from the NVM 130 via the third data buffer 244, the second data processing circuit 254, and the second data buffer 242 to the volatile memory 200 to be stored; (iii) data blocks retrieved from the volatile memory 200 to be provided to the computer system 10 via the first data buffer 240 and the first data processing circuit 252; and (iv) data blocks retrieved from the volatile memory 200 to be stored on the NVM 130 via the second data buffer 242, the second data processing circuit 254, and the third data buffer 244. In certain embodiments, the at least one data path selection circuit 210 is controlled by the at least one processor 160 (e.g., by a finite state machine).

In certain embodiments, the computer memory device 100 can be configured to facilitate virtualization, redundancy, and/or fault tolerance. For example, to facilitate virtualization, the computer memory device 100 can support multiple virtual servers and their parameters. The status register 116, the command queue 118, and the ATC 120 can each comprise multiple portions, each portion corresponding to a different virtual system, and the storage device driver 14 can be copied to all the virtual servers and the computer memory device 100 can have a command queue 118 and responses for each virtual server. Each of the multiple status register 116 portions and multiple command queue 118 portions can be used to keep track of commands and data transfers corresponding to the different virtual systems, and each of the multiple ATC 120 portions can generate physical addresses that correspond to portions of the NVM 130 that correspond to the different virtual systems. In certain other embodiments, the computer memory device 100 can comprise a single status register 116, a single command queue 118, and a single ATC 120 each configured to parse out the commands, data transfers, and physical addresses to correspond to different virtual systems. For another example, to facilitate fault tolerance, data in a failing portion of the NVM 130 can be reconstructed in other portions of the NVM 130 or in other NVMs 130 (for computer memory devices 100 comprising multiple NVMs 130). An off-line non-volatile memory array 134 can be used to replace a failing non-volatile memory array 134 by the controller 132, and data can be moved from the failing non-volatile memory array 134 and placed in a different non-volatile memory array 134.

As one example, the redundancy can be implemented by having multiple computer memory devices 100 in a computer system with one storage device driver 14 to address redundancy across the multiple computer memory devices 100 (e.g., analogous in a manner to RAID systems). As another example, the redundancy can be implemented by having one computer memory device 100 with one PMI 100 and multiple NVMs 130. In such examples, the storage device driver 14 can send user data into the computer memory device 100, and the computer memory device 100 can replicate the data or create redundancy across the multiple NVMs 130. In this example, only one NVM 130 can be active at any given time. In certain embodiments, the stripping of user data can be addressed by having each NVM 130 of the computer memory device 100 available. Once an active first NVM 130 fails (or exhibits a fault), the computer memory device 100 can activate a second NVM 130 and can switch the activity to the second NVM 130 along with transferring existing data from the first NVM 130 to the second NVM 130.

Some or all of the components of the computer memory device 100 (e.g., the PMI 110, 112, 114, 116, 118, the ATC 120, the NVM 130, the data buffers 142, 152, the one or more processors 160, 162, 164, 166, 168, the data processing circuits 170, 172, 174, 176, 178, the volatile memory 200, 220, 230, and the at least one data path selection circuit 210, 212, 214 can be manifested in one or more of the following: a field programmable gate array (FPGA), a complex programmable logic device (CPLD), an application specific integrated circuit (ASIC), an application specific standard part (ASSP), or a system-on-a-chip (SOC) device. Some or all of the one or more processors 160, 162, 164, 166, 168 can communicate with one another using one or more of the following: a scheduler, customized firmware, micro operating system (uOS), and off-the-shelf operating system (OS). Some or all of the one or more processors 160, 162, 164, 166, 168 can include a finite state machine.

Figure 8:
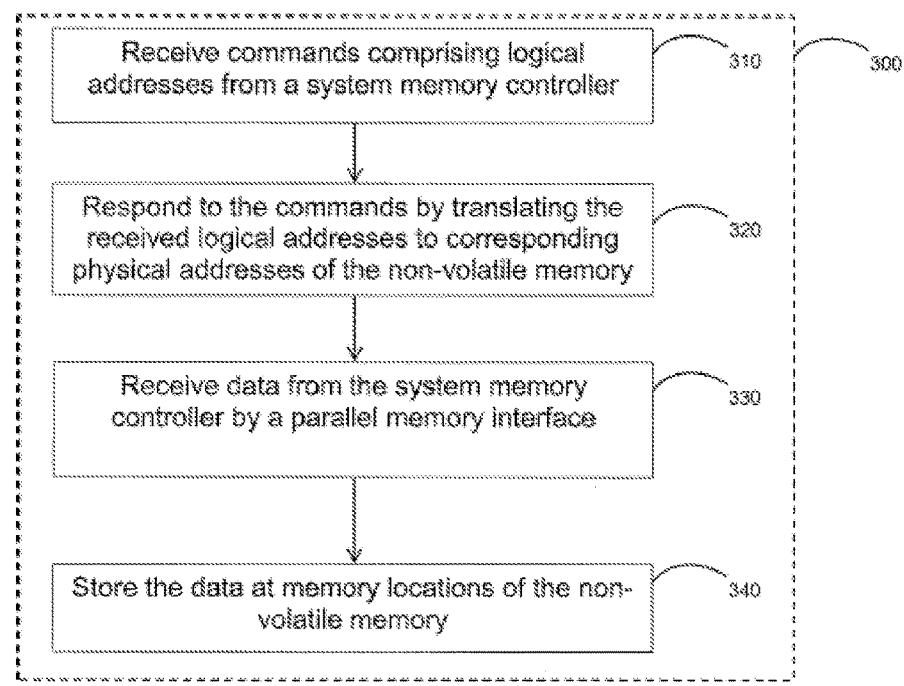
FIG. 8 is a flow diagram of an example method of storing data in accordance with certain embodiments described herein.

FIG. 8 is a flow diagram of an example method 300 of storing data in accordance with certain embodiments described herein. In an operational block 310, the method 300 comprises receiving commands from a system memory controller 16 of a computer system 10. The commands comprise logical addresses and are received by a computer memory device 100 comprising a parallel memory interface (PMI) 110 operatively coupled to the system memory controller 16 and operatively coupled to an non-volatile memory 130. In an operational block 320, the method 300 further comprises responding to the commands by translating the received logical addresses to corresponding physical addresses of the non-volatile memory 130. In an operational block 330, the method 300 further comprises receiving data from the system memory controller 16 by the PMI 110. In an operational block 340, the method 300 further comprises storing the data at memory locations of the non-volatile memory 130 corresponding to the physical addresses. In certain embodiments, in which the PMI 110 comprises a command status circuit and a command queue, the method 300 further comprises updating the command status circuit to reflect data transfer readiness by the PMI 110 and updating the command status circuit to reflect data transfer completion by the PMI 110.

Certain embodiments described herein advantageously provide improved latency and bandwidth as compared to previous systems that included non-volatile memory. While latency is dependent on the particular device characteristics (e.g., chipsets) and performance of the computer system 10 itself such that latency estimates are difficult to provide, certain embodiments described herein are configured to provide latencies that are between two and ten times shorter than latencies of conventional systems. Table 2 provides some example symbol rate and bandwidth values for various conventional serial interfaces as compared to values for certain embodiments described herein which utilize a PMI 110 as described herein.

TABLE 2

| Interface Technology | Symbol rate | Bandwidth |
|---|---|---|
| SATA (serial) | 1.5 Gb/s | 150 MB/s |
| SATA-2 (serial) | 3.0 Gb/s | 300 MB/s |
| SATA-3 (serial) | 6.0 Gb/s | 600 MB/s |
| SAS (serial) | 3.0 Gb/s | 300 MB/s |
| SAS-2 (serial) | 6.0 Gb/s | 600 MB/s |
| PCIe (serial) | 2.5 GT/s | 1000 MB/s (x4) |
| PCIe-2 (serial) | 5.0 GT/s | 2000 MB/s (x4) |
| PCIe-3 (serial) | 8.0 GT/s | 4000 MB/s (x4) |
| PMI 110 (parallel) | 1.6 GT/s | 12800 MB/s |
|  | 1.866 GT/s | 14928 MB/s |
|  | 2.133 GT/s | 17064 MB/s |

This comparison table shows advantages of certain embodiments described herein.

Embodiments have been described in connection with the accompanying drawings. However, it should be understood that the figures are not drawn to scale and are merely illustrative without representing actual dimensions or layout. In addition, the foregoing embodiments have been described at a level of detail to allow one of ordinary skill in the art to make and use the devices, systems, etc. described herein. As such, a wide variety of variation is possible and components, elements, and/or steps can be altered, added, removed, or rearranged. While certain embodiments have been explicitly described, other embodiments will become apparent to those of ordinary skill in the art based on this disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without user input or prompting, whether these features, elements and/or states are included or are to be performed in any particular embodiment.

Depending on the embodiment, certain acts, events, or functions of any of the methods described herein can be performed in a different sequence, can be added, merged, or left out completely (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, non-volatile memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Figure 9:
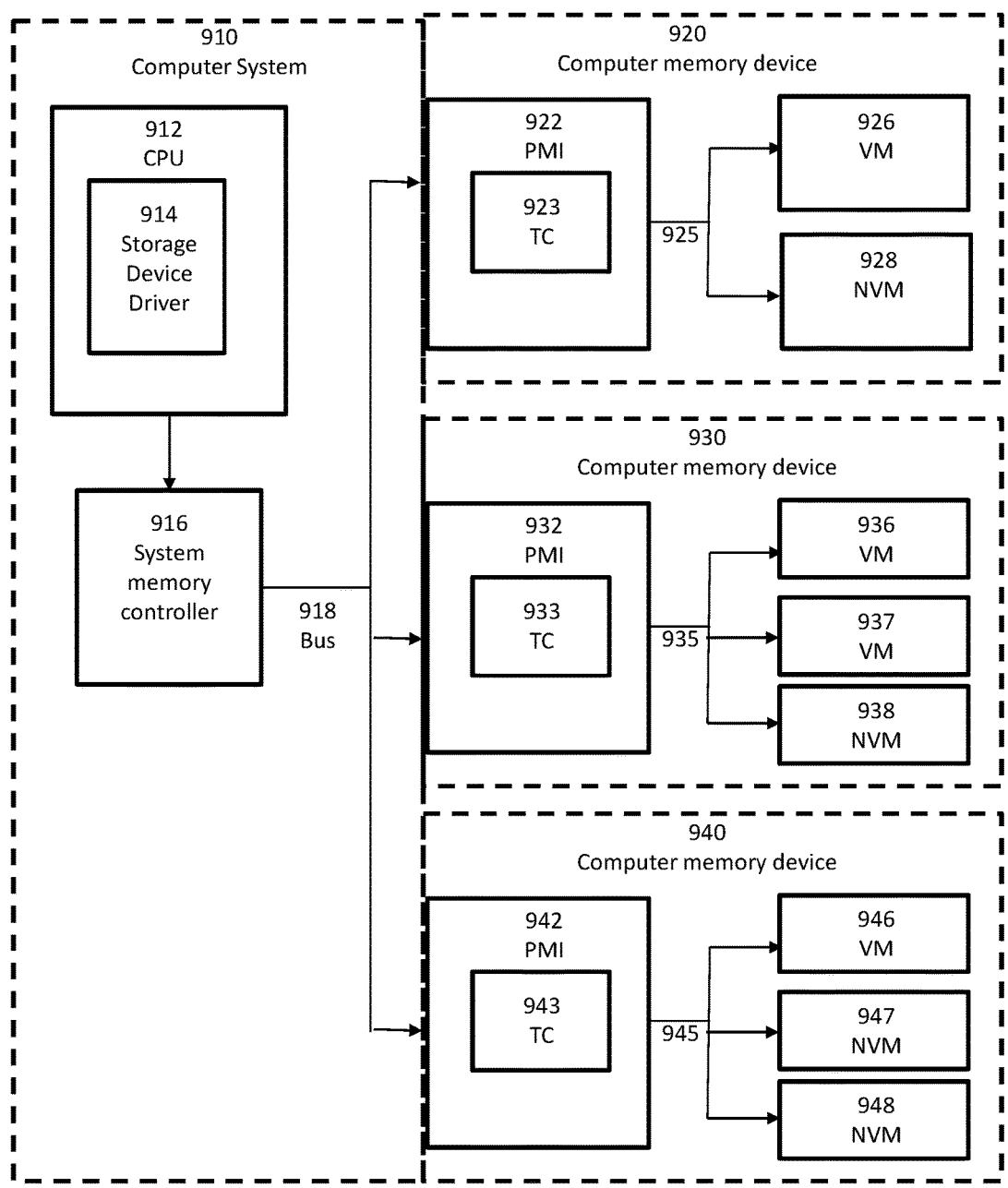
FIG. 9 schematically illustrates a system memory controller coupled to a plurality of different kinds of computer memory devices.

In FIG. 9, a computer system 910 is communicatively coupled with three different computer memory devices 920, 930, and 940, respectively. The computer system 910 has a CPU 912 upon which an instance of storage device driver 914 is instantiated. The device driver is typically a piece of software that resides on a host computer system and runs on an operating system's kernel. The device driver's job is to control, and translate, incoming access requests by applications running on an operating system to a hardware—in this case the computer memory device. Computer system 910 could be any suitable computer system, such as any of the ones described herein, with a specialized storage device driver 914 installed on it so that it can communicate with each computer memory device 920, 930, and 940, respectively. Storage device driver 914 is designed to translate complex commands from the CPU to simple variables used by system memory controller 916, such as READ/WRITE, ADDRESS, and DATA. Each of PMI 922, 932, and 942 is built to respond using simple commands that system memory controller 916 can process, such as SUCCESS/FAILURE and DATA.

Each of the computer memory devices 920, 930, and 940 are built to be operatively coupled to computer system 910 via system memory controller 916. Each computer memory device 920, 930, and 940, has a PMI, shown here as PMI 922, 932, and 942, respectively. Each PMI has hardware or software devices that receive data and commands from the system memory controller 916 via system bus 918. Typically bus 918 comprises a plurality of channels through which computer memory devices can be communicatively coupled. For example, computer system 910 could have one or more host main memory module slots (e.g., one or more standard dual in-line memory module (DIMM) slots). While only computer memory devices having a PMI and multiple memories are shown here, other memory devices could be communicatively coupled to bus 918, such as computer memory device 100 in FIG. 1, or a standard volatile memory devices such as RAM device or modules without a PMI.

In certain embodiments, two or more of the CPU 912, the storage device driver 914, and the system memory controller 916 can be manifested, in whole or in part, in the same integrated circuit. For example, the storage device driver 914 can comprise a portion of the circuitry of the CPU 912 and/or can be a software module programmed into the CPU 912 and which resides in the memory of the CPU 912 of the host computer. The storage device driver 914 can be a dedicated hardware driver or software driver of the CPU 912 that communicates with any of the computer memory devices 920, 930, and 940 and that translates transactions from the CPU 912 for communication to any of the computer memory devices 920, 930, and 940. The system memory controller 916 can be a portion of a north bridge circuit that is operatively coupled to the CPU 912. The system memory controller 916 can be operatively coupled to the host system memory controller bus 918 and, via the memory controller bus 918, to a host main memory interface (e.g., a DIMM slot) that is configured to be operatively coupled to any of the computer memory devices 920, 930, and 940.

Each computer memory device comprises a translation circuit (TC), shown here as embedded within each PMI, but could be separate from the PMI if necessary, such as ATC 120 shown in FIG. 1. Each translation circuit 923, 933, and 943, respectively, receives transmissions from system memory controller 916 and translates them into various commands to be executed upon computer memory device 920, 930, and 940 respectively. The translation circuit is generally loaded on the computer memory device as a portion of the firmware. The translation circuit receives device driver commands from device driver 914 and interprets the commands to manage the local hardware device.

Each computer memory device shown here has a different number and type of memory. PMI 922 of computer memory device 920 is coupled to volatile memory 926 and non-volatile memory 928 via bus 925. PMI 932 of computer memory device 930 is coupled to volatile memory 936, volatile memory 937, and non-volatile memory 938 via bus 935. PMI 942 is coupled to volatile memory 946, non-volatile memory 947, and non-volatile memory 948 via bus 945. Contemplated memory types include NAND, PCM, SRAM, ReRAM, Memristor, RCRAM, 3D Xpoint, DDR and MRAM. Computer memory devices can have several different types of only volatile memory or several different types of only non-volatile memory, and could also have many more memory modules than those contemplated.

PMI 922 could be built to receive and transmit data from and to system memory controller 916 via bus 918. PMI 922 has a translation circuit 923 which is configured to receive transmissions from system memory controller 916 and decode them into commands for computer memory device 920. For example, the ADDRESS portion of a data command could be used to dictate different commands. An ADDRESS of 1 could be interpreted to mean a READ/WRITE to volatile memory 926, an ADDRESS of 2 could be interpreted to mean a READ/WRITE to non-volatile memory 928, an ADDRESS of 3 could be interpreted to mean a command to retrieve the status of all queues, an ADDRESS of 4 could be interpreted to mean a command to copy data from one memory location to another memory location, an address of 5 could be interpreted to mean a command to move data from one memory location to another memory location, and so on and so forth. In that embodiment, the number of commands would only be limited to the maximum ADDRESS value. In some embodiments, a command to READ or WRITE data from a particular type of memory could be selected as a bit in a register part of computer memory device 920.

The actual logical or physical address could be embedded in a header of the DATA portion of the transmission. In some embodiments, a portion of the memory address could be transmitted in the ADDRESS and another portion of the memory address could be transmitted in the DATA. Or the ADDRESS could be completely ignored, and all commands could be transmitted in a portion of DATA. Preferably, data commands are sent to computer memory device 920 using a WRITE command, so that additional information is transmitted using the DATA portion of the transmission. Since DATA portions can be 64-Bytes (or 512 bits), a large variety of commands, data addresses, and other information could be embedded in the DATA portion of the transmission.

Various commands received from system memory controller 916 could be saved in a command queue, and executed sequentially, in parallel, or in accordance with a command ordering optimization algorithm, in order, out-of-order, and depending on the complexity of PMI 922. For example, a command queue could be built to execute 128 separate commands separately. When a command to retrieve the status of computer memory device 920 is received, the status information on the entire command queue could be returned at once and embedded in a portion of DATA that is sent back to system memory controller 916, which optimizes status updates.

When a command to copy or move data from one memory location to another is received, PMI 922 could move data from one memory to another (e.g. from volatile memory 926 to non-volatile memory 928) or from one memory location to another memory location within the same memory (e.g. within non-volatile memory 928. This means that the data is transmitted only using data bus 925, without using valuable bandwidth on bus 918. In a contemplated embodiment, an application for computer system 910 could be loaded on a traditional DRAM (not shown) coupled to bus 918, and data cache for the application could be loaded on a portion of non-volatile memory 928, and a storage archive for the application could be loaded on another portion of non-volatile memory 928. A command could then be sent to transmit data from the cache to the storage archive, which could be performed rapidly by computer memory device 920 without taking up system resources on bus 918.

Similar translation templates could be implemented on TC 933 and TC 943 to control computer memory devices 930 and 940, respectively. It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of processing commands, comprising:
   receiving a first command from a system memory controller of a computer system, the first command comprising a first read/write identifier, a first logical address, and a first set of data;
   recognizing that the first read/write identifier comprises a write command;
   translating at least one of the first logical address and a first portion of the first set of data into a first memory selection command to select a first selected memory from at least one of a first memory of a first type and a second memory of a second type;
   translating a second portion of the first set of data into a first logical memory address and a first sub-set of data to be written;
   translating the first logical memory address into a first physical memory address of the first selected memory; and
   storing the first sub-set of data at the first physical memory address of the first selected memory.

2. The method of claim 1, wherein the first type comprises a volatile memory and the second type comprises a non-volatile memory.

3. The method of claim 1, wherein the memory selection command selects the selected memory from at least one of the first memory of the first type, the second memory of the second type, and a third memory of a third type.

4. The method of claim 3, wherein the first type and the second type comprise two different types of non-volatile memory, and the third type comprises a volatile memory.

5. The method of claim 4, wherein the two different types of non-volatile memory are selected from the group consisting of NAND Flash, PCM, MRAM, ReRAM, Memristor, and 3D Xpoint.

6. The method of claim 3, wherein the first type and the second type comprise two different types of volatile memory, and the third type comprises a non-volatile memory.

7. The method of claim 6, wherein the two different types of volatile memory are selected from the group consisting of RAM, SRAM, DRAM, DDR and MRAM.

8. The method of claim 1, further comprising:
   receiving a second command from the system memory controller of the computer system, the second command comprising a second read/write identifier, a second logical address, and a second set of data;
   recognizing that the read/write identifier comprises a read command;
   translating the second logical address into a second memory selection command to select a second selected memory from at least one of the first memory of the first type and the second memory of the second type;
   translating the second set of data into a second logical memory address;

translating the second logical memory address into a second physical memory address of the second selected memory;

reading a set of read data from the second physical memory address of the second selected memory; and transmitting the set of read data to the system memory controller of the computer system.

9. The method of claim 1, further comprising:

receiving a second command from the system memory controller of the computer system, the second command comprising a second read/write identifier, a second logical address, and a second set of data;

translating at least one of the second logical address and the second set of data into a command to read a status of a computer memory device;

reading a status of a plurality of states of the computer memory device; and transmitting the status of the plurality of states of the computer memory device.

10. The method of claim 9, wherein the plurality of states comprises a plurality of queue states of the computer memory device.

11. The method of claim 10, wherein the plurality of queue states comprises 128 queues of the computer memory device.

12. The method of claim 1, further comprising:

receiving a second command from the system memory controller of the computer system, the second command comprising a second read/write identifier, a second logical address, and a second set of data;

translating the second logical address into a command to copy a second set of data from the first memory to the second memory;

translating the first set of data into a second physical memory address of the first memory and a third physical memory address of the second memory; and copying the second set of data from the second physical memory address of the first memory to the third physical memory address of the second memory.

13. The method of claim 12, wherein the first memory comprises a data cache and the second memory comprises a storage space.

14. The method of claim 1, further comprising:

receiving a second command from the system memory controller of the computer system, the second command comprising a second read/write identifier, a second logical address, and a second set of data;

translating the second logical address into a command to copy a second set of data from a first portion of the first memory to a second portion of the first memory;

translating the first set of data into a second physical memory address of the first memory and a third physical memory address of the first memory; and copying the second set of data from the second physical memory address of the first memory to the third physical memory address of the first memory.

15. The method of claim 14, wherein the first memory comprises a data cache and the second memory comprises a storage space.

* * * * *